(12) United States Patent
Wen et al.

(10) Patent No.: US 12,408,420 B2
(45) Date of Patent: Sep. 2, 2025

(54) SEMICONDUCTOR DEVICE AND METHOD

(71) Applicant: Taiwan Semiconductor Manufacturing Co., Ltd., Hsinchu (TW)

(72) Inventors: Kai-Qiang Wen, Hsinchu (TW); Shih-Fen Huang, Jhubei (TW); Shih-Chun Fu, Hsinchu (TW); Chi-Yuan Shih, Hsinchu (TW); Feng Yuan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 509 days.

(21) Appl. No.: 17/656,935

(22) Filed: Mar. 29, 2022

(65) Prior Publication Data

US 2023/0317714 A1    Oct. 5, 2023

(51) Int. Cl.
| | |
|---|---|
| *H10D 84/80* | (2025.01) |
| *H01L 21/265* | (2006.01) |
| *H10D 1/47* | (2025.01) |
| *H10D 30/01* | (2025.01) |
| *H10D 30/62* | (2025.01) |
| *H10D 64/01* | (2025.01) |

(52) U.S. Cl.
CPC ..... *H10D 84/811* (2025.01); *H01L 21/26513* (2013.01); *H10D 1/47* (2025.01); *H10D 30/024* (2025.01); *H10D 30/6211* (2025.01); *H10D 64/017* (2025.01)

(58) Field of Classification Search
CPC ........... H01L 27/0629; H01L 21/26513; H01L 28/20; H01L 29/66545; H01L 29/66795; H01L 29/7851; H01L 21/823821; H01L 27/0924; H01L 29/165; H01L 29/6656; H01L 29/7848; H10D 84/811; H10D 1/47; H10D 30/024; H10D 30/6211; H10D 64/017; H10D 30/797; H10D 62/822; H10D 64/021; H10D 84/0193; H10D 84/038; H10D 84/853
USPC ............................................. 257/157
See application file for complete search history.

(56) References Cited

U.S. PATENT DOCUMENTS

| | | | |
|---|---|---|---|
| 4,931,844 A * | 6/1990 | Zommer | H01L 29/7815 257/E29.066 |
| 9,647,071 B2 | 5/2017 | Peng et al. | |
| 11,264,502 B2 * | 3/2022 | Chang | H01L 21/308 |
| 11,973,124 B2 * | 4/2024 | Chang | H01L 29/66507 |

* cited by examiner

*Primary Examiner* — Tan N Tran

(74) *Attorney, Agent, or Firm* — Slater Matsil, LLP

(57) ABSTRACT

A method includes: forming a fin protruding from a substrate; implanting an n-type dopant in the fin to form an n-type channel region; implanting a p-type dopant in the fin to form a p-type channel region adjacent the n-type channel region; forming a first gate structure over the n-type channel region and a second gate structure over the p-type channel region; forming a first epitaxial region in the fin adjacent a first side of the first gate structure; forming a second epitaxial region in the fin adjacent a second side of the first gate structure and adjacent a first side of the second gate structure; and forming a third epitaxial region in the fin adjacent a second side of the second gate structure.

20 Claims, 38 Drawing Sheets

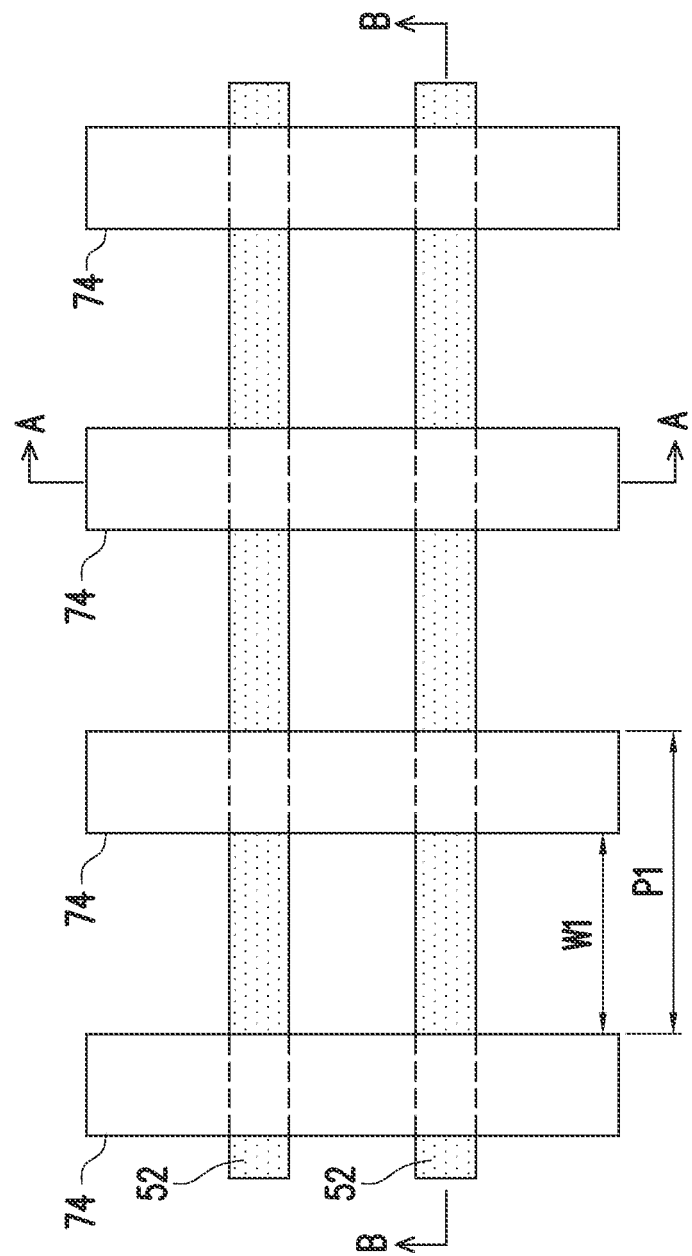

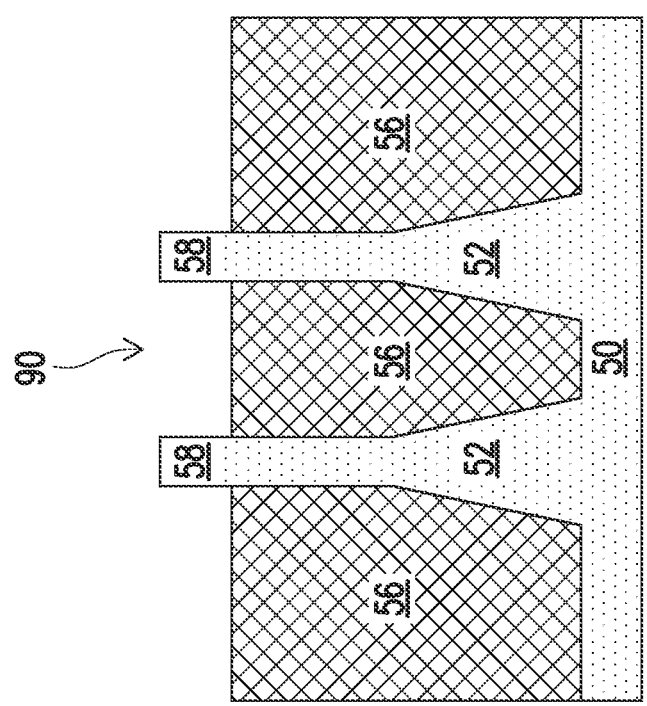

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A, 6B, 7, 8A, 8B, 8C, 9A, 9B, 10A, 10B, 10C, 10D, 10E, 11A, 11B, 12A, 12B, 13A, 13B, 14A, 14B, 14C, 14D, 15A, 15B, and 15C are various views of intermediate stages in the manufacturing of a transistor device with an active resistor, in accordance with some embodiments.

DETAILED DESCRIPTION

Figure 1:
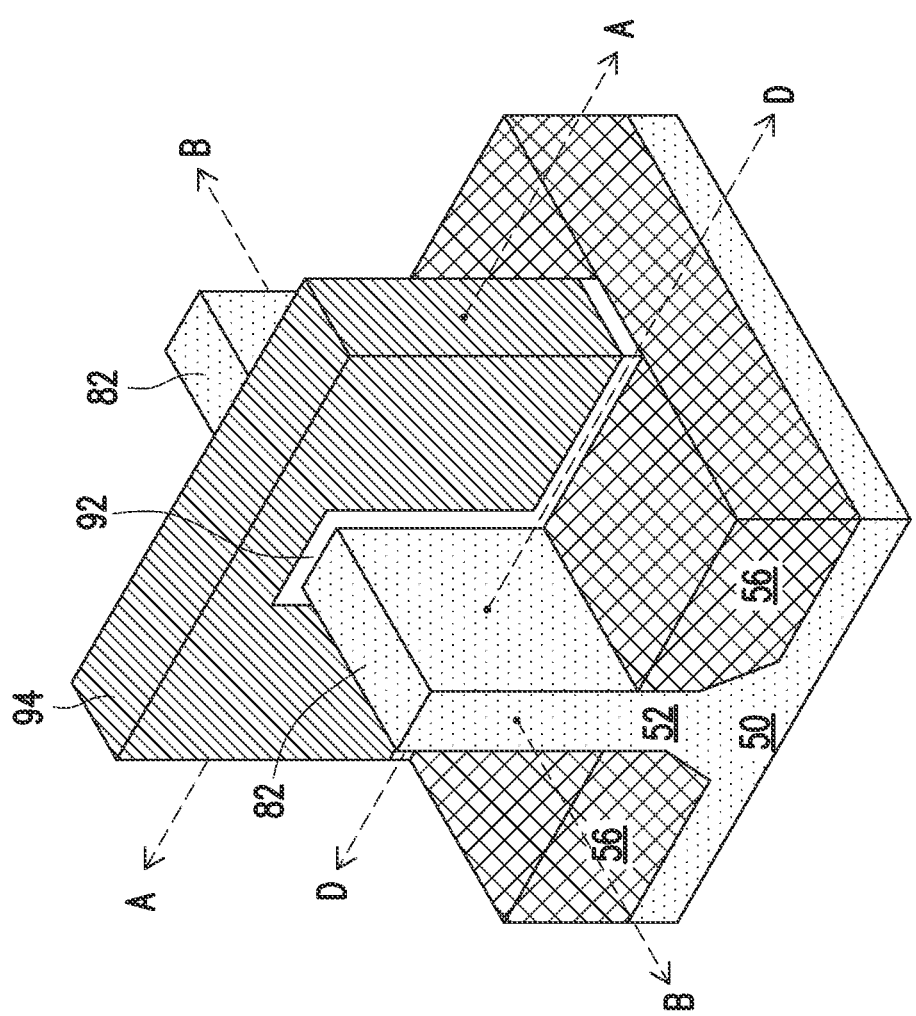
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor devices including transistors electrically connected to adjacent resistors and the methods of forming the same are provided, in accordance with some embodiments. The resistors are formed using the same processing steps as the transistors, which can decrease device size and manufacturing cost. For example, the resistors may be formed in the same fin as an adjacent FinFET. The resistors may include passive resistors or variable resistors that have a resistance controllable by an applied voltage. Some embodiments include a transistor device comprising a transistor and resistor(s) coupled in a source-degenerated configuration. Using the resistors described herein as source-degeneration resistors coupled to a transistor can reduce the effects of the transistor's noise (e.g., flicker noise).

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section D-D is parallel to cross-section A-A and extends through a source/drain region 82 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 17C are cross-sectional views of intermediate stages in the manufacturing of FinFETs, in accordance with some embodiments. FIGS. 2 through 5 are illustrated along reference cross-section A-A illustrated in FIG. 1, except for multiple fins/FinFETs. FIGS. 6A, 8A, 9A, 10A, 11A, 12A, 13A, 14A, 15A, and 17A are illustrated along reference cross-section A-A illustrated in FIG. 1, and FIGS. 6B, 8B, 9B, 10B, 11B, 12B, 13B, 14B, 14D, 15B, and 17B are illustrated along reference cross-section B-B illustrated in FIG. 1, except for multiple fins/FinFETs. FIGS. 8C, 10C, 14C, 15C, and 17C are plan views. FIGS. 10D and 10E are illustrated along reference cross-section D-D illustrated in FIG. 1, except for multiple fins/FinFETs.

Figure 2:
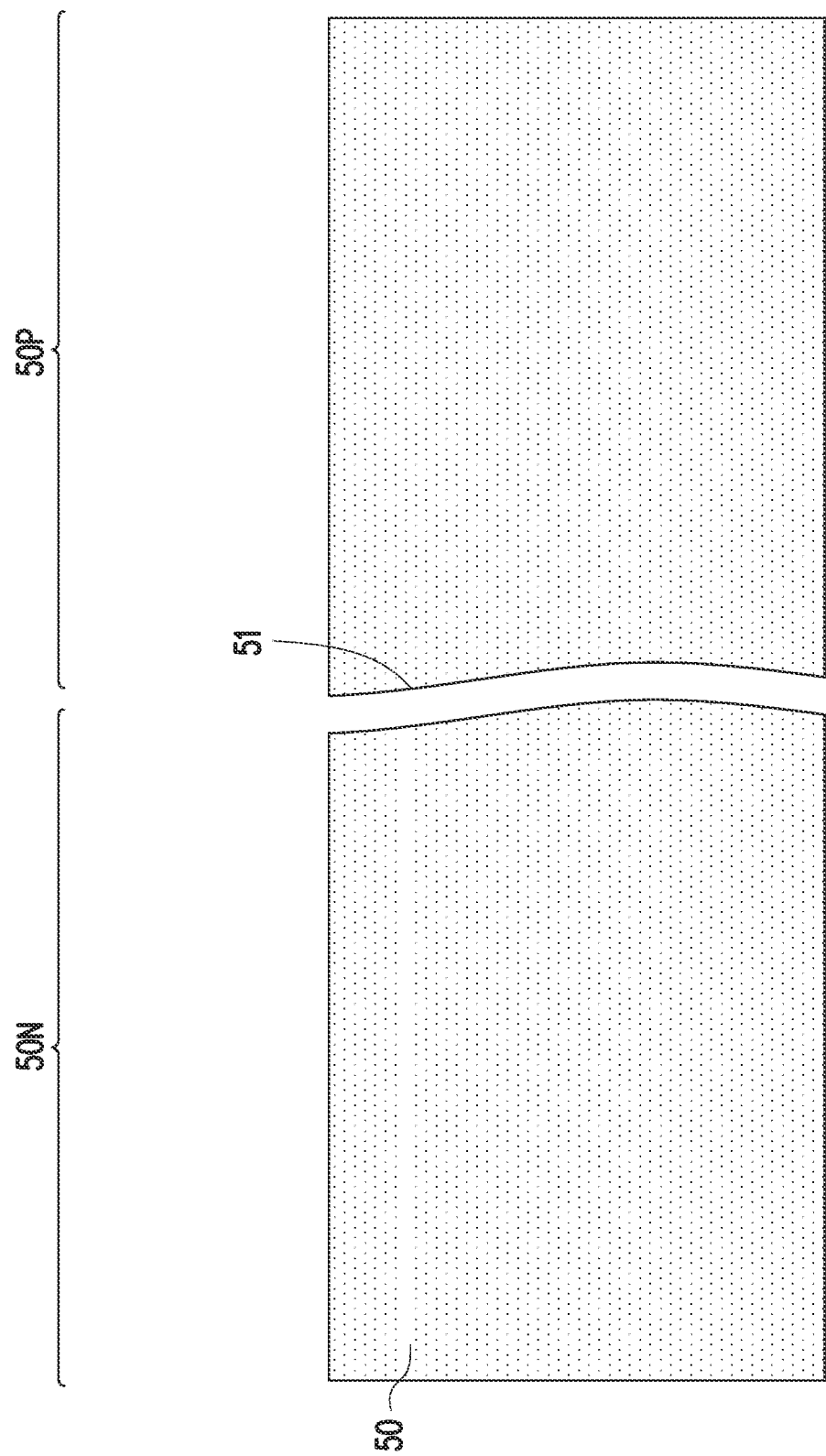
FIGS. 2, 3, 4, and 5 are cross-sectional views of intermediate stages in the manufacturing of a transistor device, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
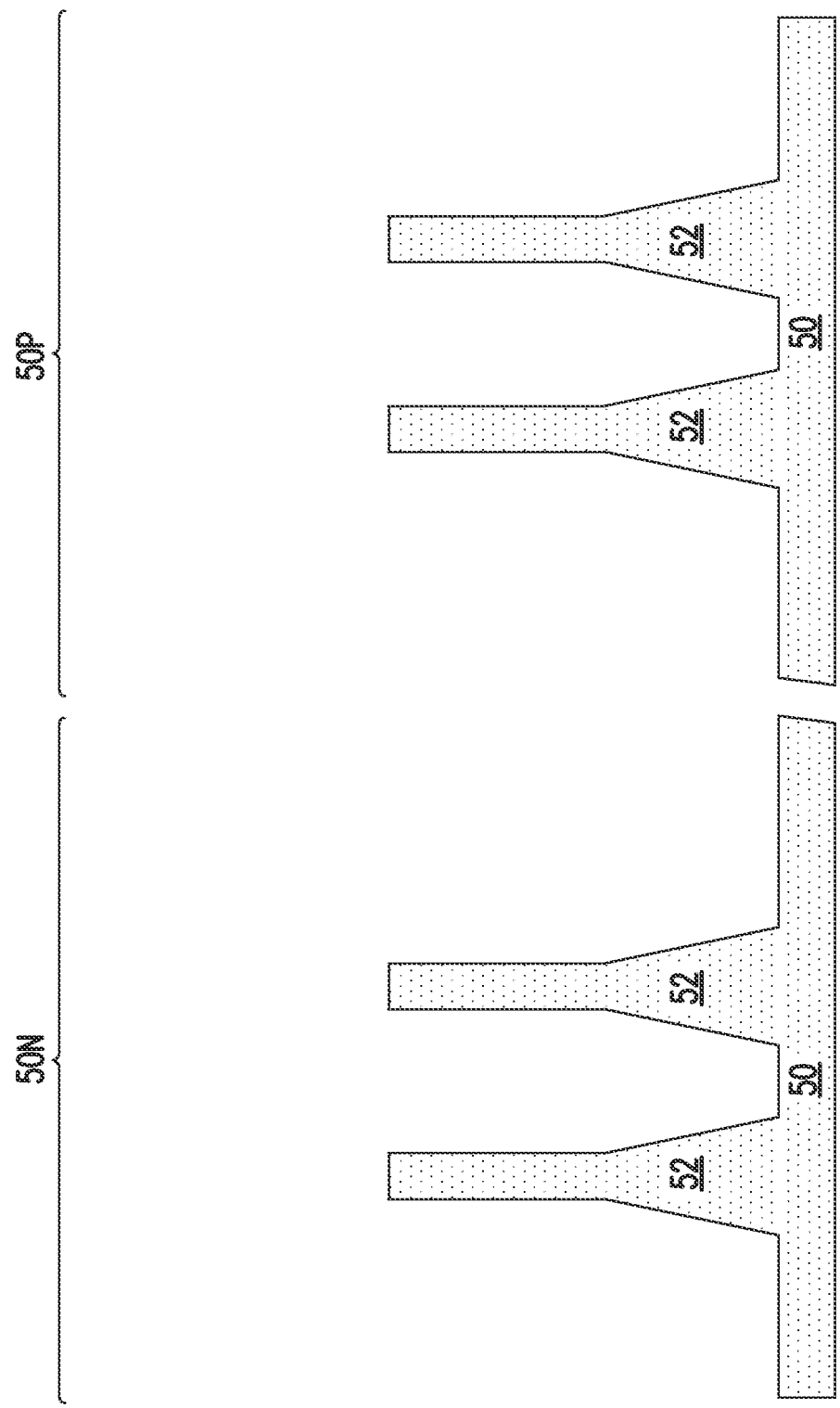

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
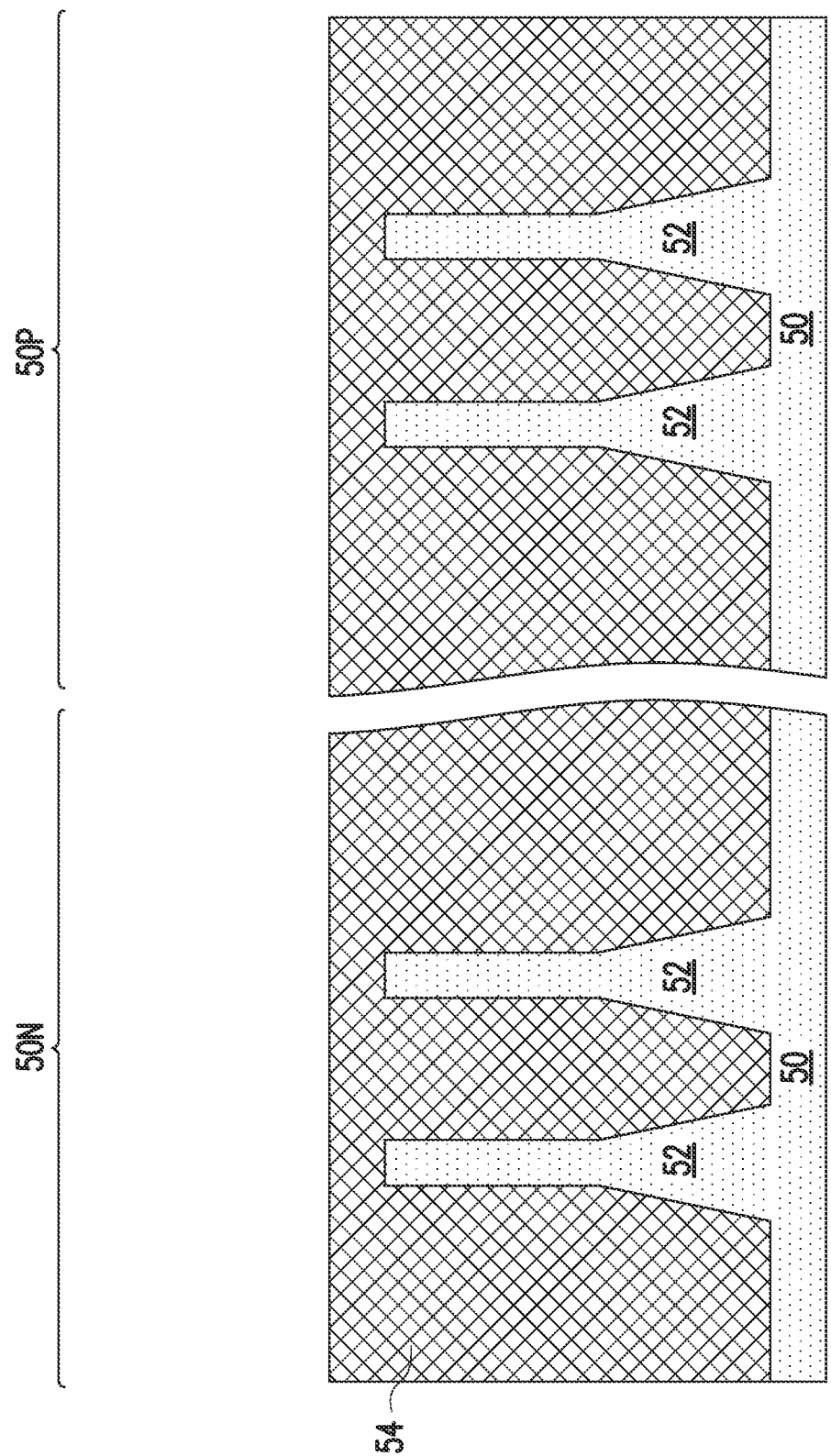

In FIG. 4, an insulation material 54 is formed over the substrate 50 and between neighboring fins 52. The insulation material 54 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
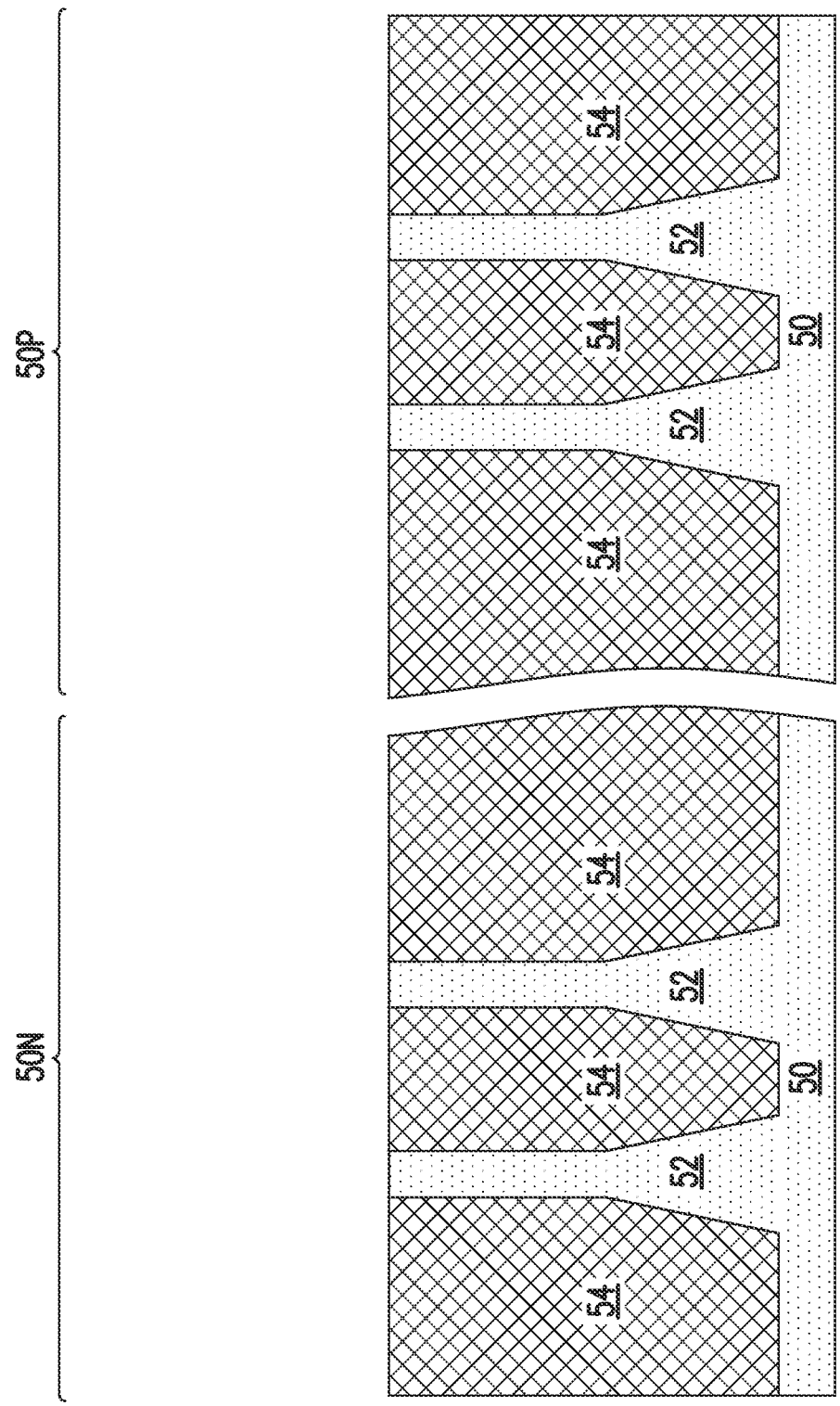

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6A:
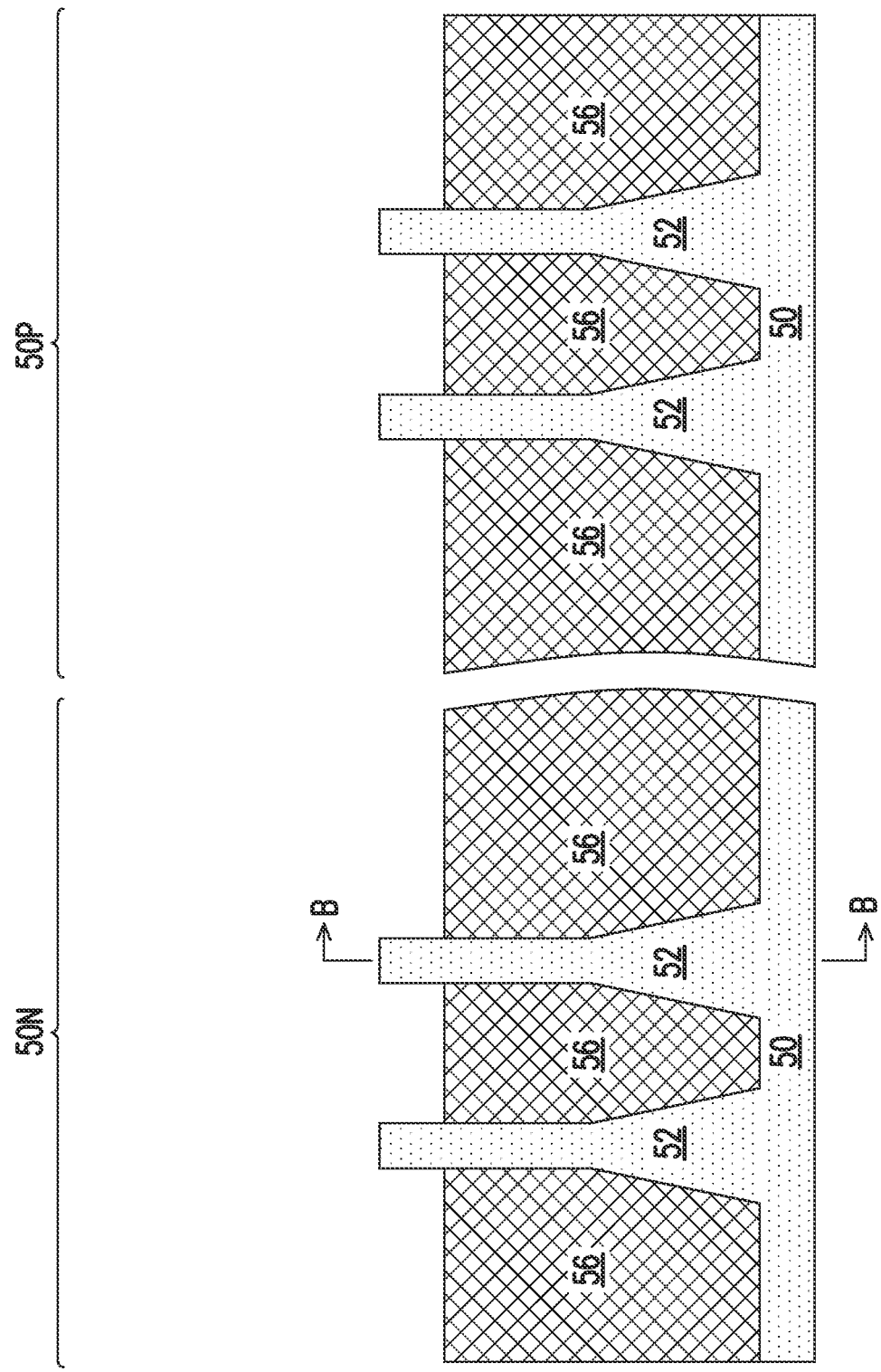

In FIG. 6A, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6A is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6A, appropriate wells may be formed in the fins 52 and/or the substrate 50. In some embodiments, a P-well may be formed in the n-type region 50N, and an N-well may be formed in the p-type region 50P. In some embodiments, a P-well or an N-well are formed in both the n-type region 50N and the p-type region 50P.

Figure 6B:
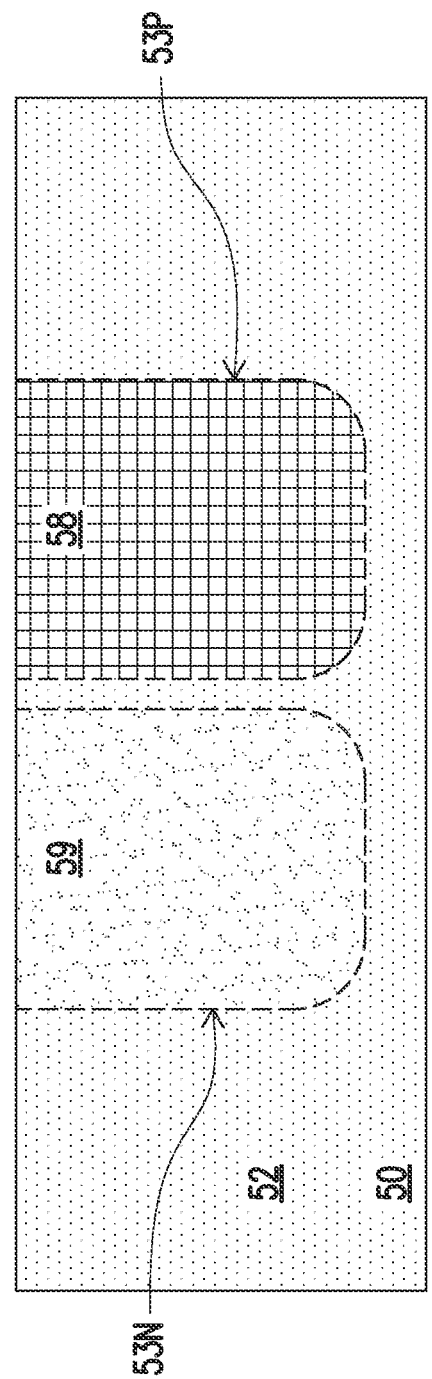

As an illustrative example, FIG. 6B shows a cross-sectional view of the n-type region 50N along the reference cross-section B-B shown in FIG. 6A, in accordance with some embodiments. As shown in FIG. 6B, both an N-well 53N and a P-well 53P may be formed in the fins 52. A P-well 53P may be formed in the fin 52 for an n-type device such as a FinFET (e.g., FinFET 120 in FIGS. 14A-14C) or the like. For example, a channel region 58 of a FinFET may be formed within a P-well 53P. In some embodiments, an N-well 53N may be formed in the fin 52 for an active resistor (e.g., active resistor 121 in FIGS. 14A-14C), a passive resistor (e.g., passive resistor 123 in FIGS. 17A-17C), or the like. For example, a conductive channel 59 of an active resistor and/or a passive resistor may be formed within an N-well 53N.

FIG. 6B shows the n-type region 50N, but N-wells 53N and/or P-wells 53P may be formed in the p-type region 50P for FinFETs, active resistors, passive resistors, the like, or for other devices. In other embodiments, a region 50N/50P may have a different number or configuration of wells. For example, in other embodiments, more than one N-well 53N or P-well 53P may be present, or a region 50N/50P may be free of either N-wells 53N or P-wells 53P. The wells may have different sizes or shapes than shown, and may extend across multiple devices (e.g., across multiple FinFETs, active resistors, passive resistors, or other devices). An N-well 53N may be adjacent to a P-well 53P or separated from a P-well 53P. In some cases, an N-well 53N and a P-well 53P may overlap.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, the like, or a combination thereof implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than about $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

In other embodiments, the implants of the n-type region 50N and the p-type region 50P may be performed at a different stage in the manufacturing process than described above. For example, the implants may be performed prior to forming the fins 52 in the substrate 50 or at another step. In some embodiments, multiple implants may be performed at different stages, and additional implants may be performed in addition to those for the N-well 53N and the P-well 53P. For example, implants for lightly doped source/drain (LDD) regions may also be performed, described in greater detail below. Any suitable combination or configuration of implants may be used to form FinFETs, active resistors, and passive resistors as described herein, and all such variations are considered within the scope of the present disclosure.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
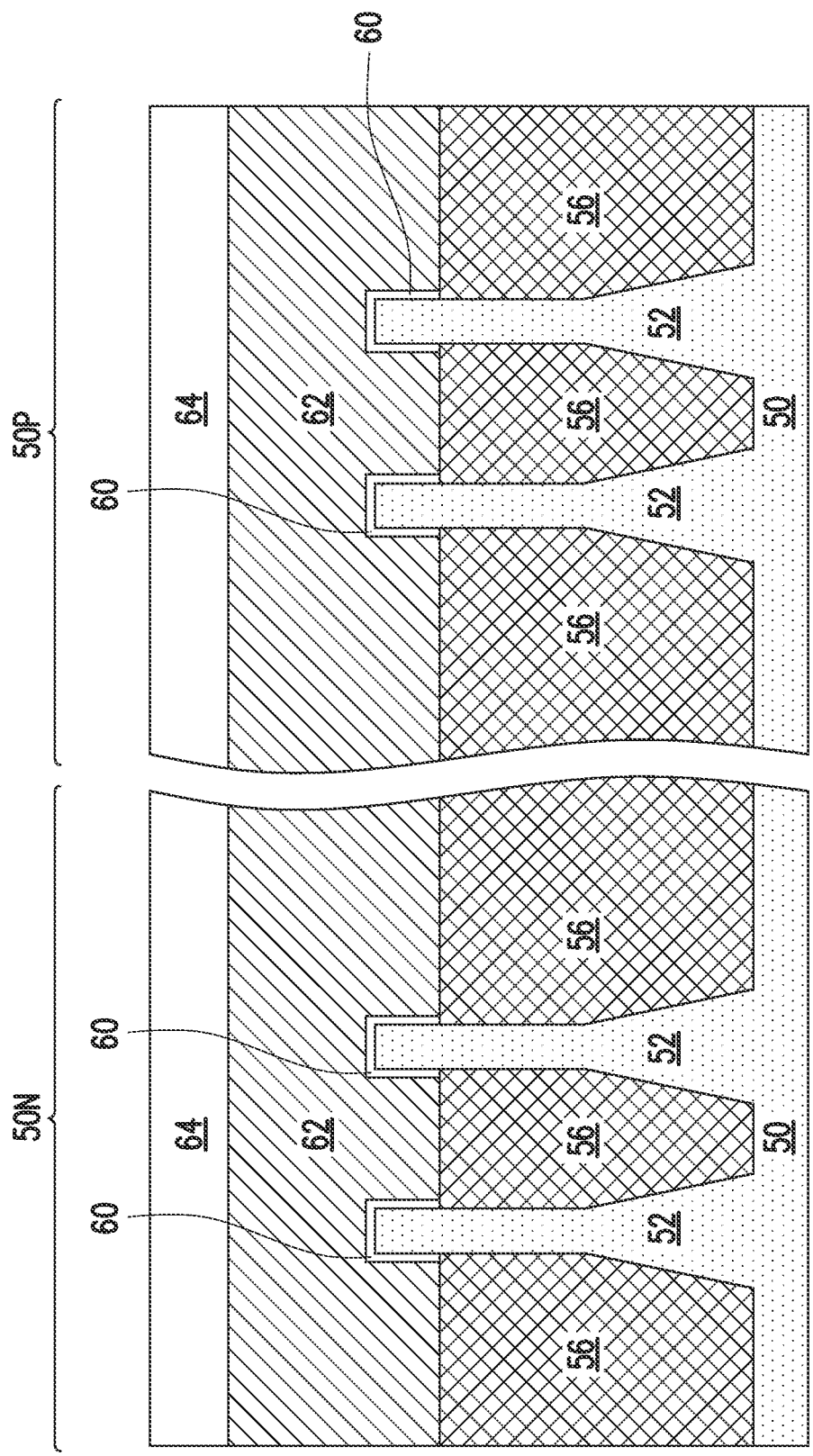

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 15C illustrate various additional steps in the manufacturing of embodiment devices. FIGS. 8A through 15C illustrate features in the n-type region 50N, but similar embodiments may be formed in the p-type region 50P. An example of a device in the p-type region 50P is described below for FIG. 18. In some cases, the structures illustrated in FIGS. 8A through 15C may be applicable to both the n-type region 50N and the p-type region 50P. Differences (if any) in the structures of the n-type region 50N and the p-type region 50P are described in the text accompanying each figure.

Figure 8A:
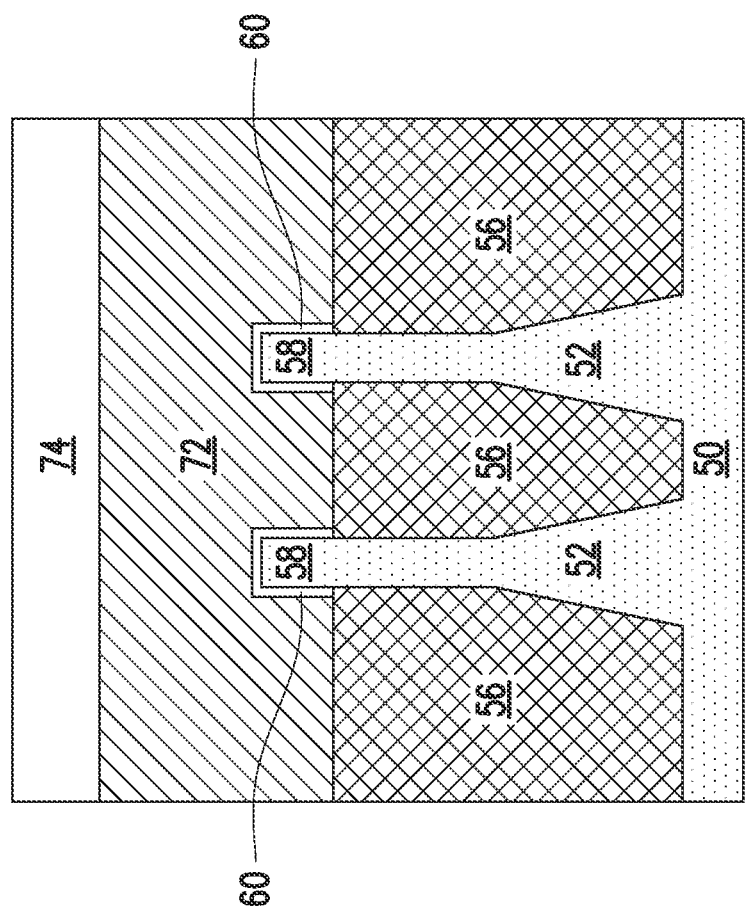
Figure 8B:
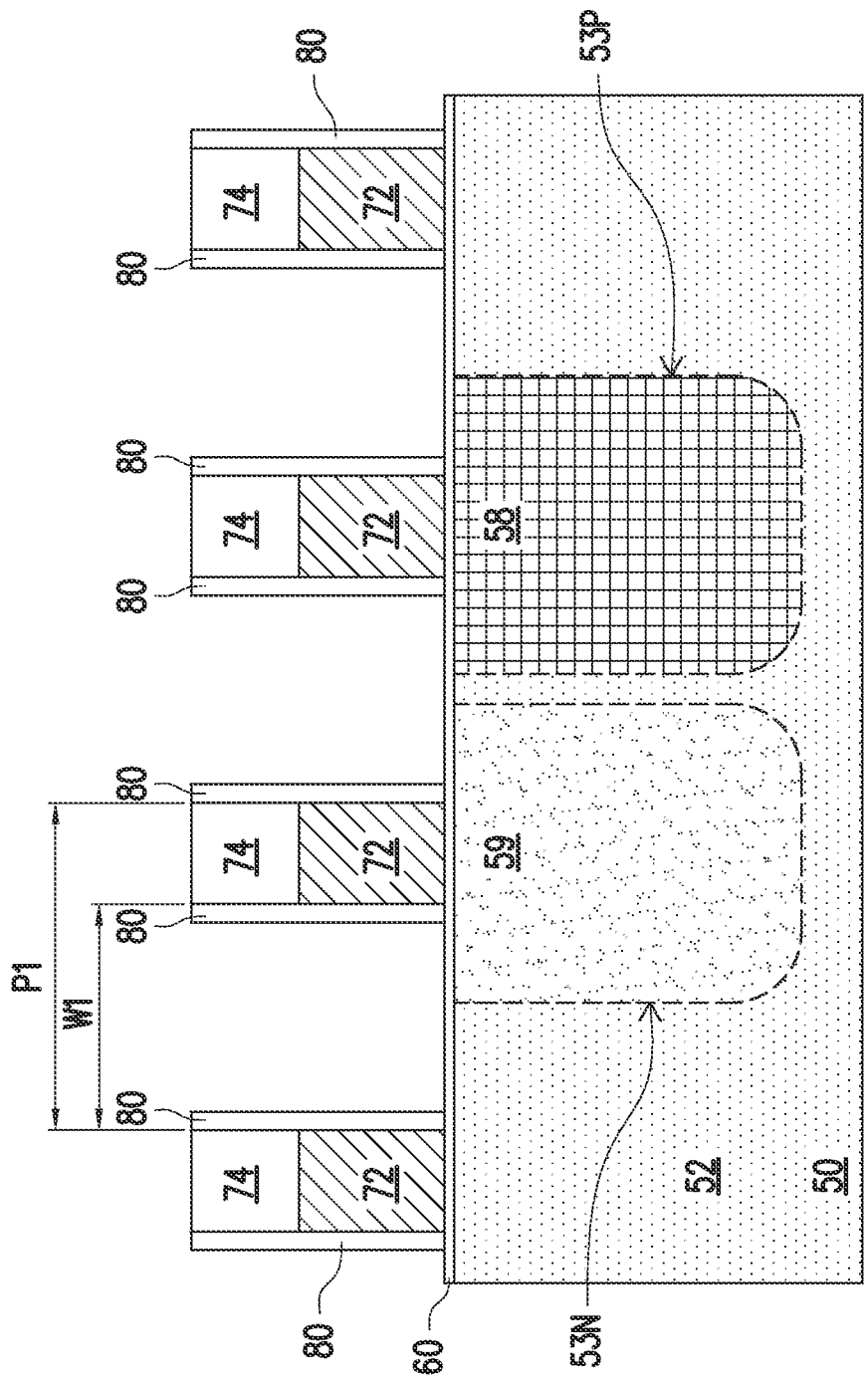

In FIGS. 8A, 8B and 8C, the mask layer 64 (see FIG. 7) may be patterned and gate seal spacers 80 may be formed, in accordance with some embodiments. FIG. 8A illustrates a cross-sectional view along reference cross-section A-A, and FIG. 8B illustrates a cross-sectional view along reference cross-section B-B. FIG. 8C illustrates a plan view, though some features are not shown for clarity reasons. The mask layer 64 may be pattered using acceptable photolithography and etching techniques to form masks 74. The pattern of the masks 74 may be transferred to the dummy gate layer 62 to form dummy gates 72. A dummy gate 72 and its overlying mask 74 may be collectively referred to herein as a "dummy gate stack." In some embodiments (not illustrated), the pattern of the masks 74 may also be transferred to the dummy dielectric layer 60 by an acceptable etching technique. One or more of the dummy gates 72 may cover respective channel regions 58 of the fins 52 or respective conductive channels 59 of the fins 52. The pattern of the masks 74 may be used to physically separate each of the dummy gates 72 from adjacent dummy gates 72. The dummy gates 72 may also have a lengthwise direction substantially perpendicular to the lengthwise direction of respective epitaxial fins 52. In some embodiments, adjacent dummy gate stacks may be separated by a distance W1 that is in the range of about 3 nm to about 1000 nm. The dummy gate stacks may be formed having a pitch P1 that is in the range of about 16 nm to about 1500 nm. Other distances are possible.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, the like, or a combination thereof.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in the range of about $10^{15}$ cm$^{-3}$ to about $10^{19}$ cm$^{-3}$. An anneal may be used to repair implant damage and to activate the implanted impurities. In some embodiments, a region 50N/50P may have both n-type and p-type implants. In some embodiments, the LDD implants may be implanted as part of the formation of the conductive channel 59.

Figure 9A:
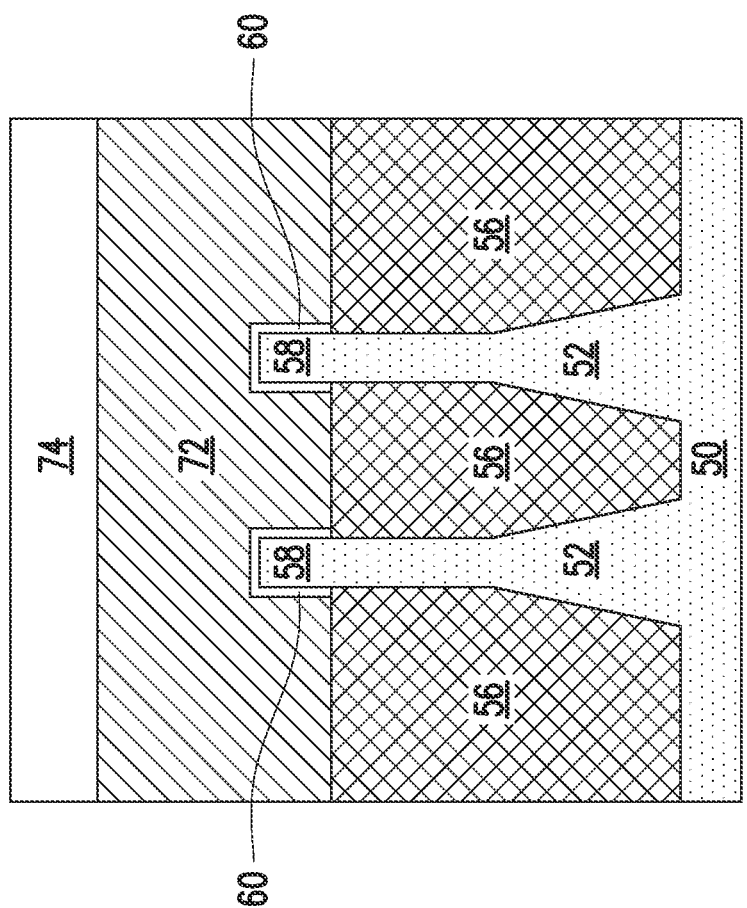
Figure 9B:
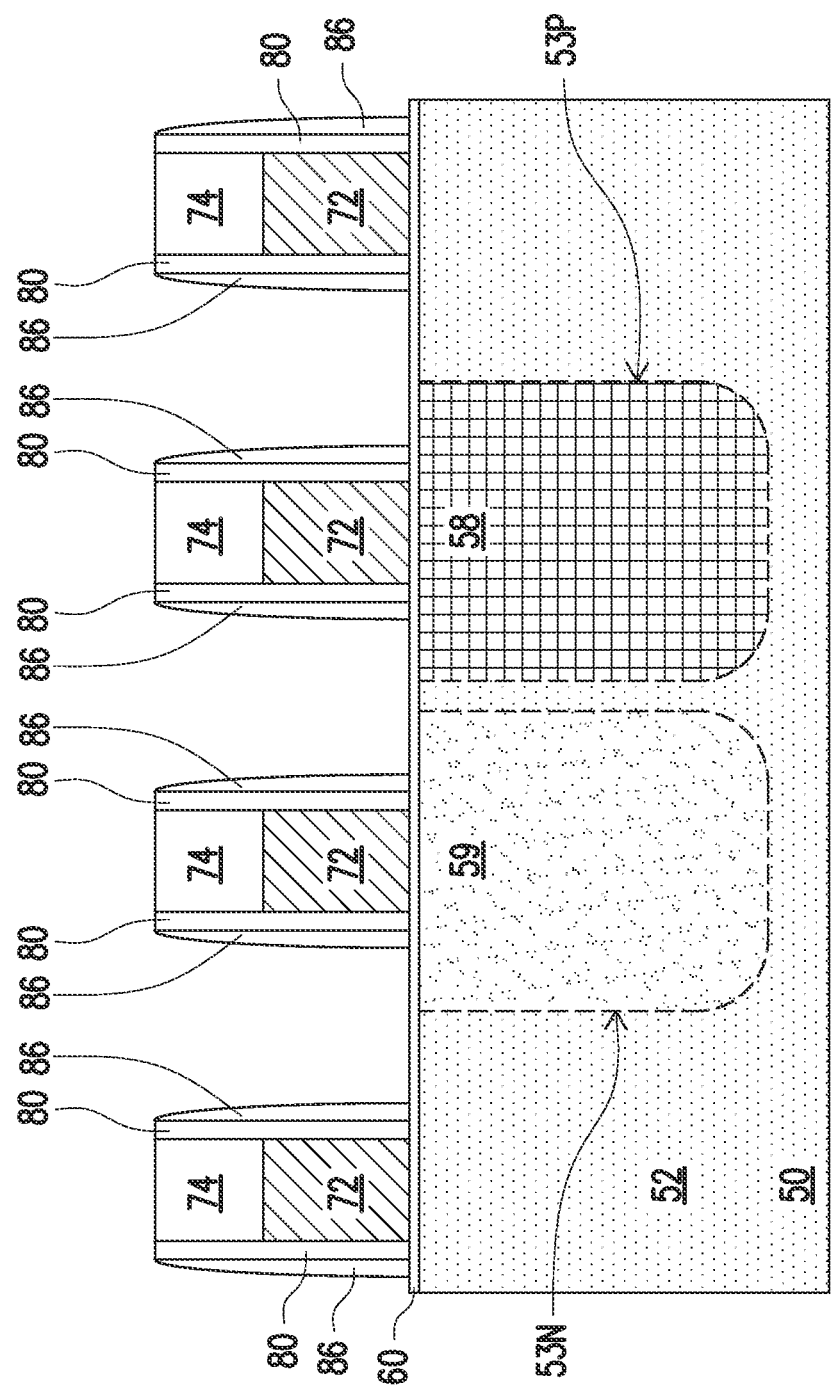

In FIGS. 9A and 9B, gate spacers 86 are formed on the gate seal spacers 80 along sidewalls of the dummy gates 72 and the masks 74, in accordance with some embodiments. The gate spacers 86 may be formed by conformally depositing an insulating material and subsequently anisotropically etching the insulating material. The insulating material of the gate spacers 86 may comprise silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers), spacers may be formed and removed, and/or the like. Furthermore, the n-type and p-type devices may be formed using different structures and steps. For example, LDD regions for n-type devices may be formed prior to forming the gate seal spacers 80 while the LDD regions for p-type devices may be formed after forming the gate seal spacers 80.

Figure 10A:
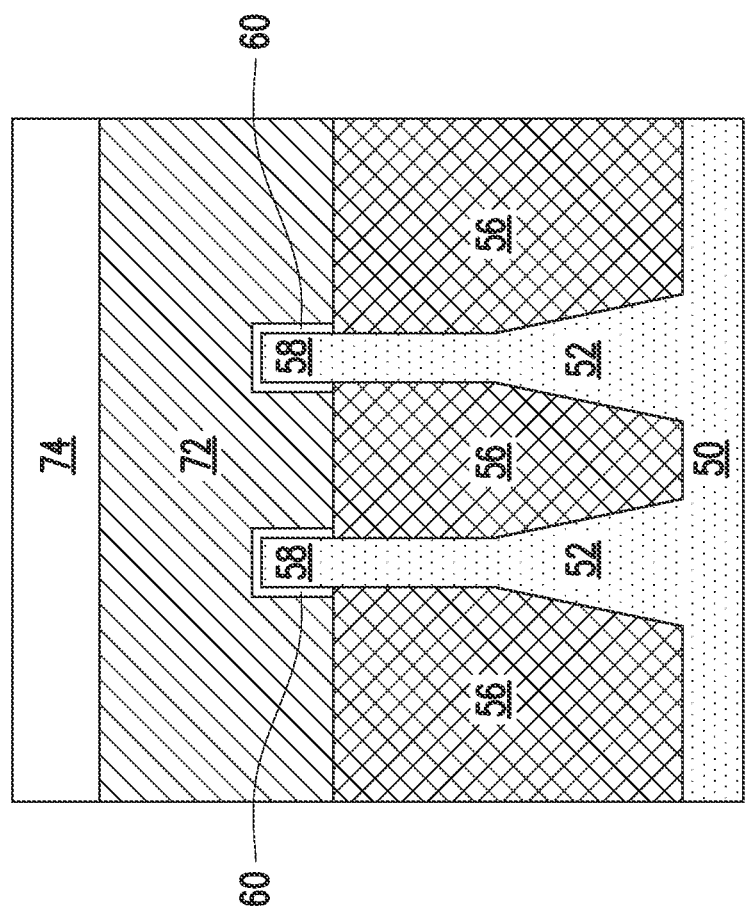
Figure 10B:
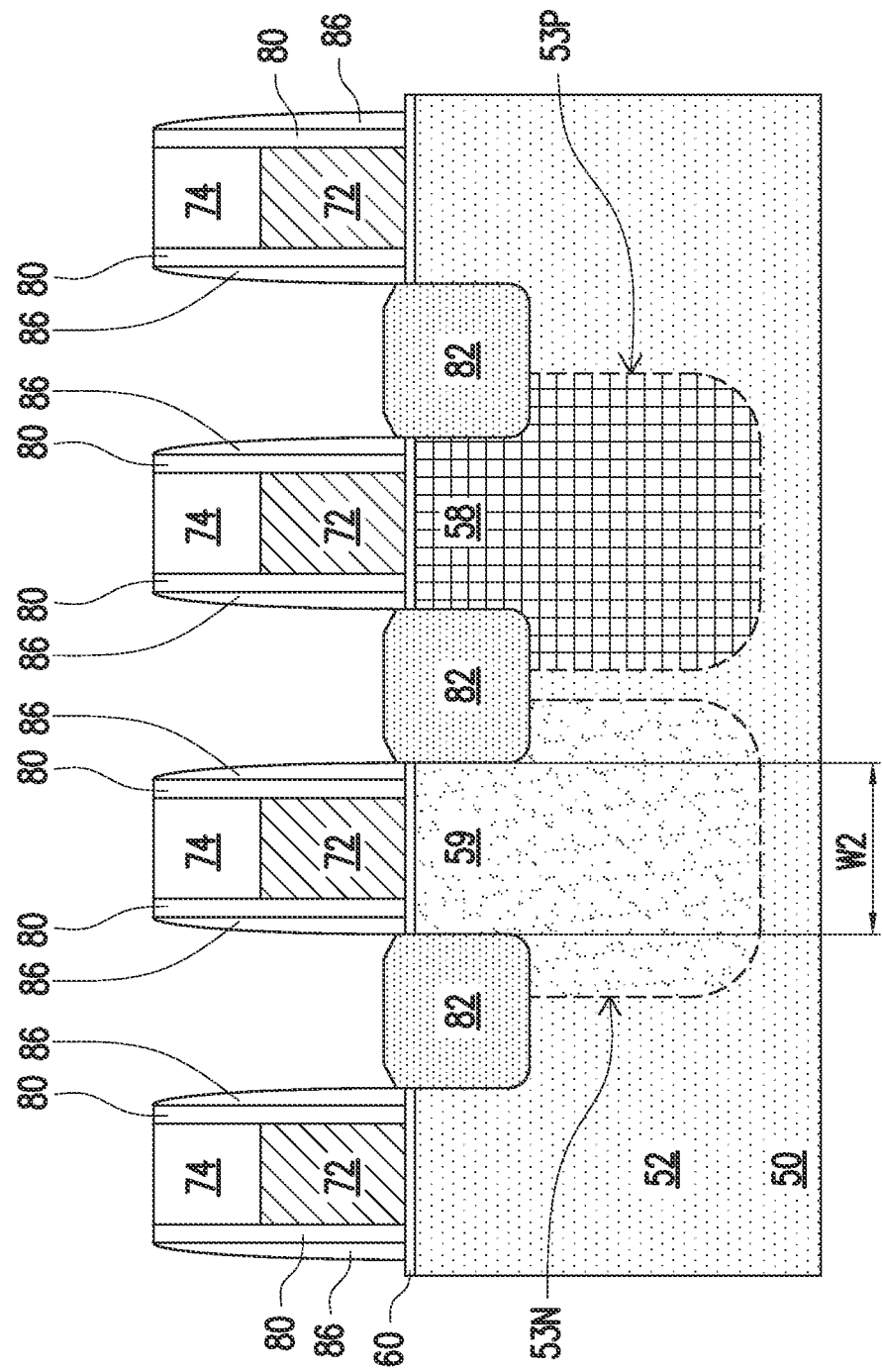
Figure 10C:
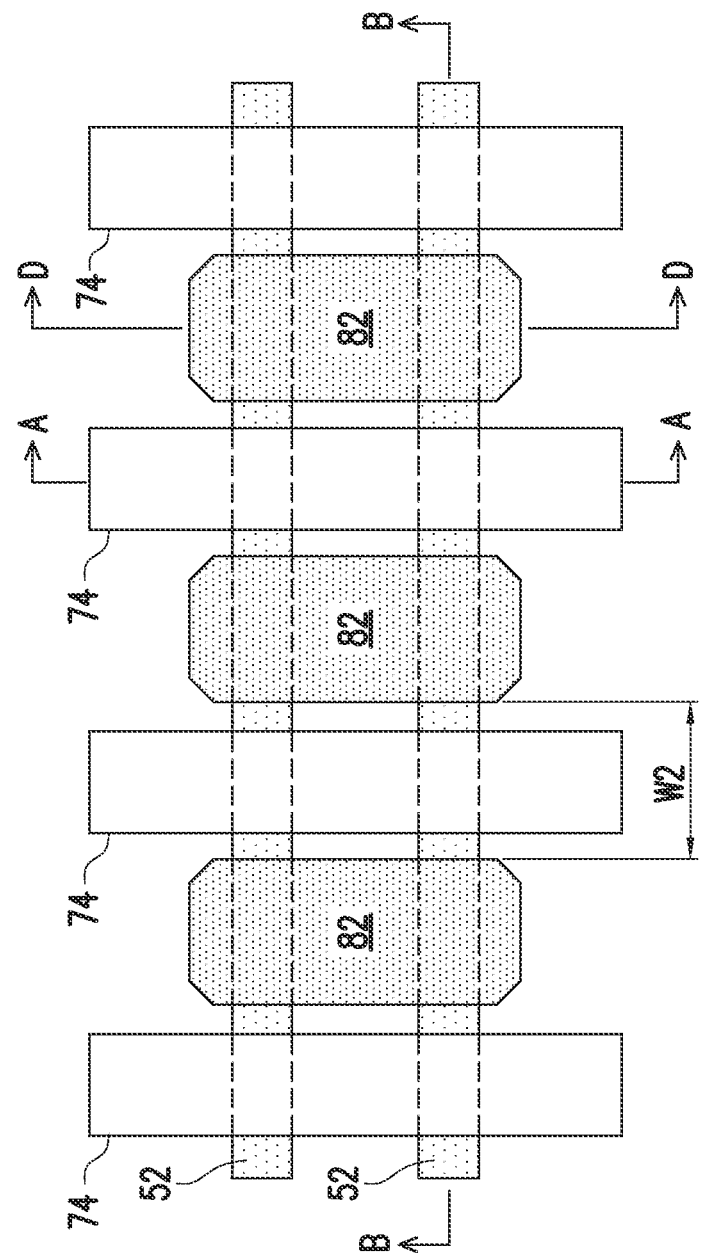
Figure 10D:
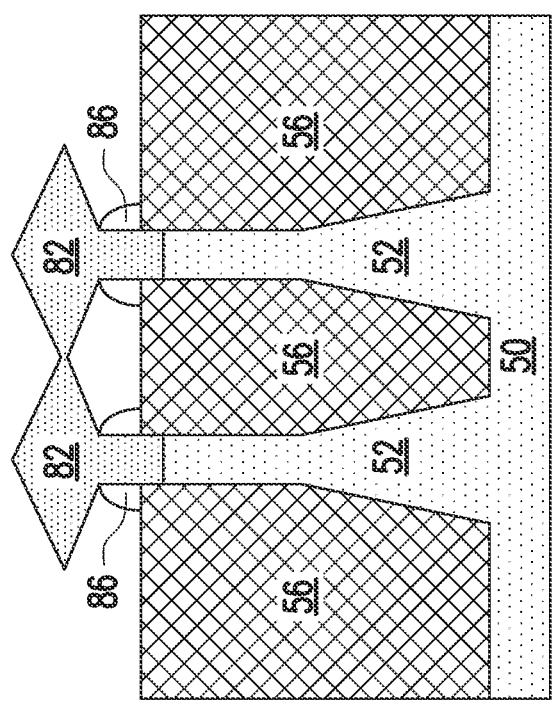
Figure 10E:
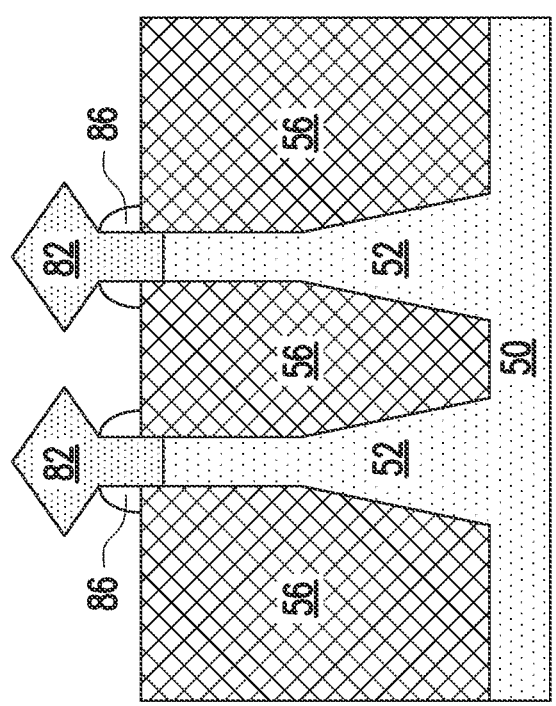

In FIGS. 10A, 10B, and 10C, epitaxial regions 82 are formed in the fins 52, in accordance with some embodiments. FIG. 10A illustrates a cross-sectional view along reference cross-section A-A, and FIG. 10B illustrates a cross-sectional view along reference cross-section B-B. FIG. 10C illustrates a plan view, though some features are not shown for clarity reasons. FIGS. 10D and 10E are illustrated along reference cross-section D-D. The epitaxial regions 82 are formed in the fins 52 such that each dummy gate 72 is disposed between respective neighboring pairs of the epitaxial regions 82. In some embodiments the epitaxial regions 82 may extend into, and may also penetrate through, the fins 52. In some embodiments, the gate spacers 86 are used to separate the epitaxial regions 82 from the dummy gates 72 by an appropriate lateral distance so that the epitaxial regions 82 do not short out subsequently formed gates of the resulting FinFETs. A material of the epitaxial regions 82 may be selected to exert stress in the respective channel regions 58, thereby improving performance.

The epitaxial regions 82 in the n-type region 50N may be formed by masking the p-type region 50P and etching source/drain regions of the fins 52 in the n-type region 50N to form recesses in the fins 52. Then, the epitaxial regions 82 in the n-type region 50N are epitaxially grown in the recesses. The epitaxial regions 82 may include any acceptable material, such as appropriate for n-type FinFETs. For example, if the fin 52 is silicon, the epitaxial regions 82 in the n-type region 50N may include materials exerting a tensile strain in the channel region 58, such as silicon, silicon carbide, phosphorous-doped silicon carbide, silicon phosphide, the like, or a combination thereof. The epitaxial regions 82 in the n-type region 50N may have surfaces raised from respective surfaces of the fins 52 and may have facets.

The epitaxial regions 82 in the p-type region 50P may be formed by masking the n-type region 50N and etching source/drain regions of the fins 52 in the p-type region 50P to form recesses in the fins 52. Then, the epitaxial regions 82 in the p-type region 50P are epitaxially grown in the recesses. The epitaxial regions 82 may include any acceptable material, such as appropriate for p-type FinFETs. For example, if the fin 52 is silicon, the epitaxial regions 82 in the p-type region 50P may comprise materials exerting a compressive strain in the channel region 58, such as silicon germanium, boron-doped silicon germanium, germanium, germanium tin, the like, or a combination thereof. The epitaxial regions 82 in the p-type region 50P may have surfaces raised from respective surfaces of the fins 52 and may have facets.

The epitaxial regions 82 and/or the fins 52 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial regions 82 may be in situ doped during growth.

As a result of the epitaxy processes used to form the epitaxial regions 82 in the n-type region 50N and the p-type region 50P, upper surfaces of the epitaxial regions have facets which expand laterally outward beyond sidewalls of the fins 52. In some embodiments, these facets cause adjacent epitaxial regions 82 to merge, as illustrated by FIGS. 10C and 10D. In other embodiments, adjacent epitaxial regions 82 remain separated after the epitaxy process is completed, as illustrated by FIG. 10E. In the embodiments illustrated in FIGS. 10D and 10E, gate spacers 86 are formed covering a portion of the sidewalls of the fins 52 that extend above the STI regions 56, thereby blocking the epitaxial growth. In some other embodiments, the spacer etch used to form the gate spacers 86 may be adjusted to remove the spacer material to allow the epitaxially grown region to extend to the surface of the STI region 56.

Figure 11A:
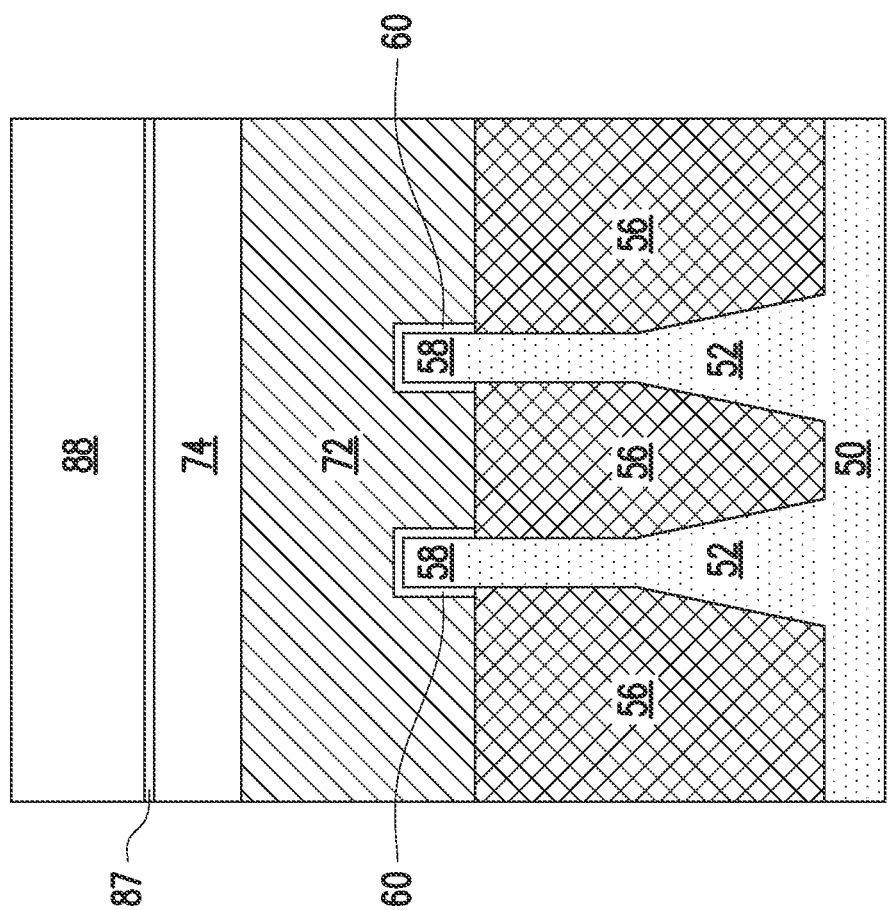
Figure 11B:
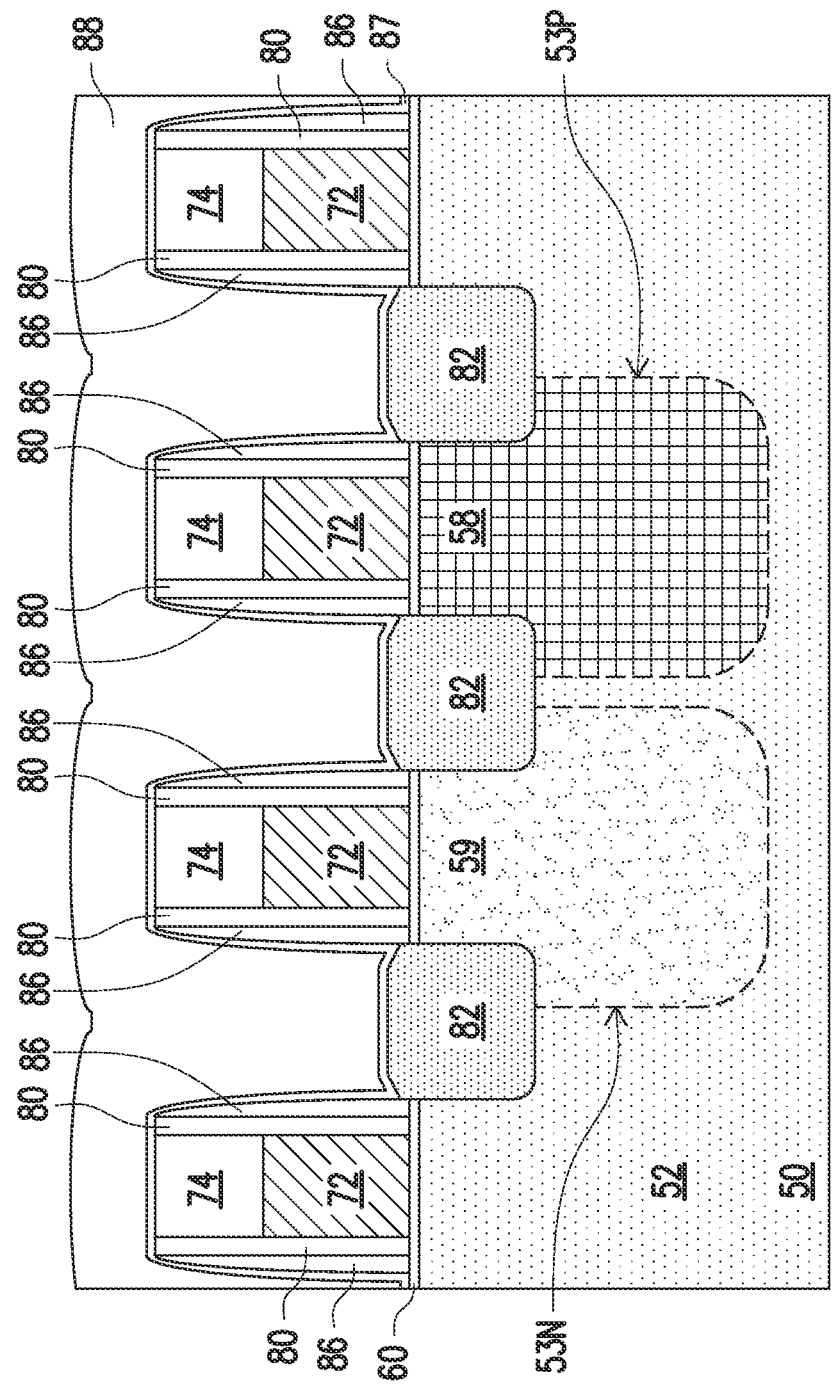

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), the like, or a combination thereof. Other insulation materials formed by any acceptable process may be used. In some embodiments, a contact etch stop layer (CESL) 87 is disposed between the first ILD 88 and the epitaxial regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12A:
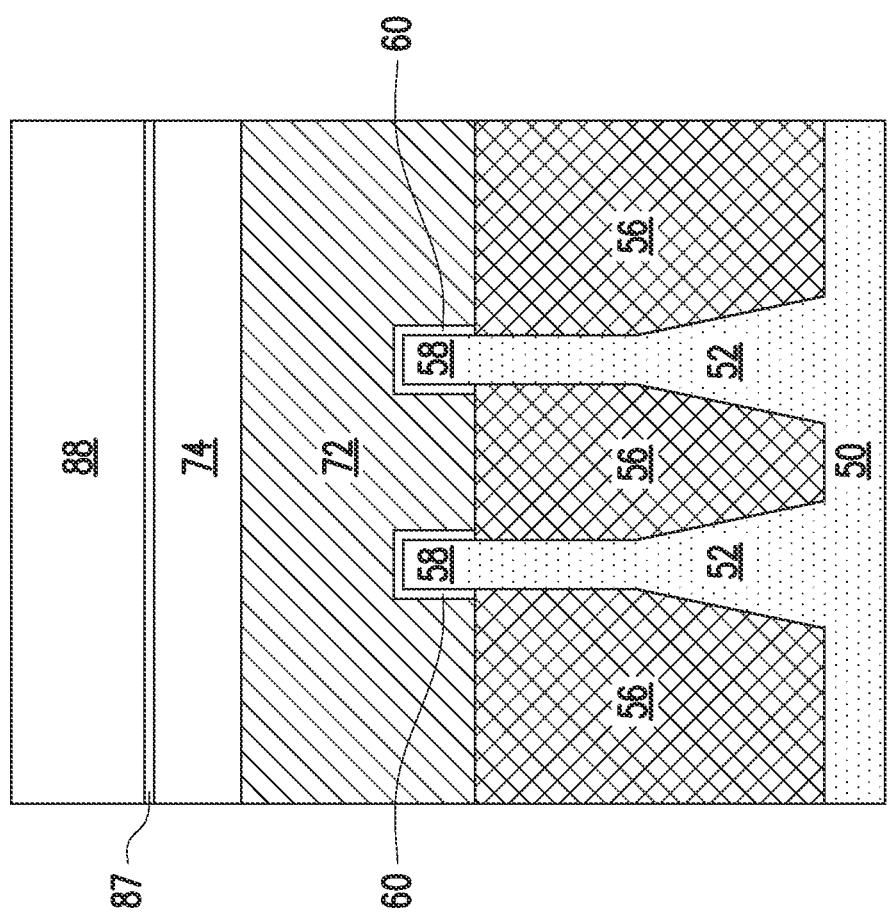
Figure 12B:
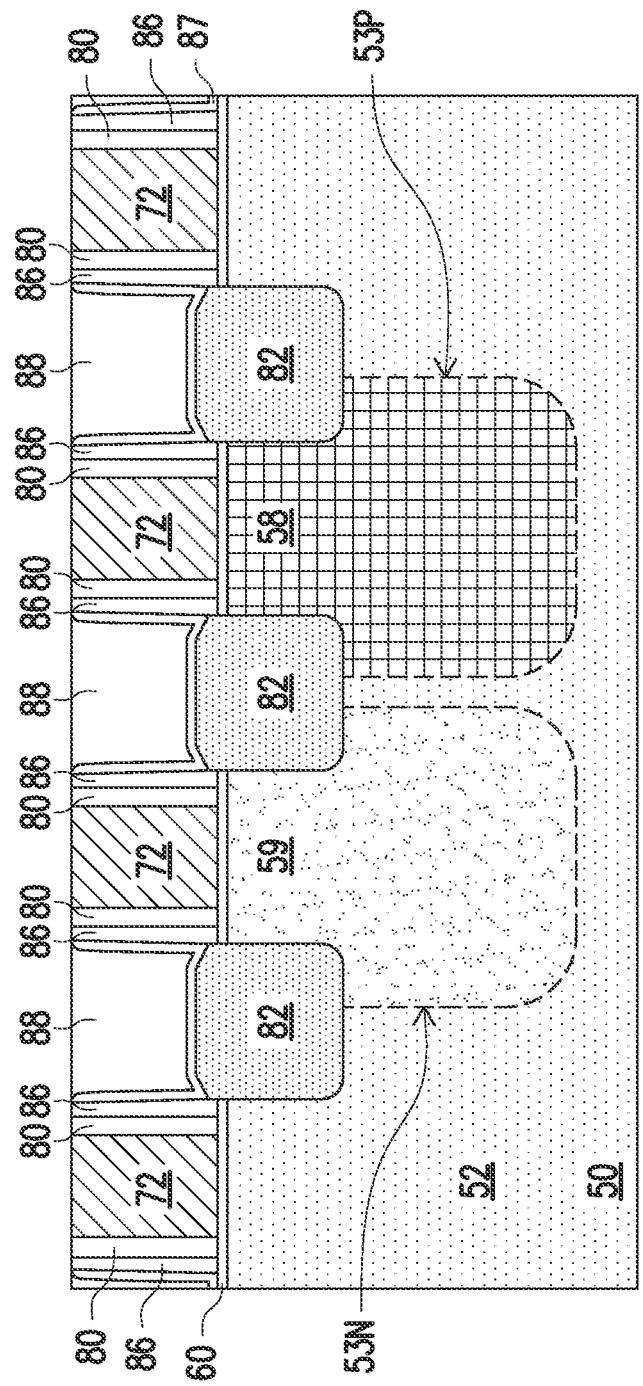

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the masks 74.

Figure 13B:
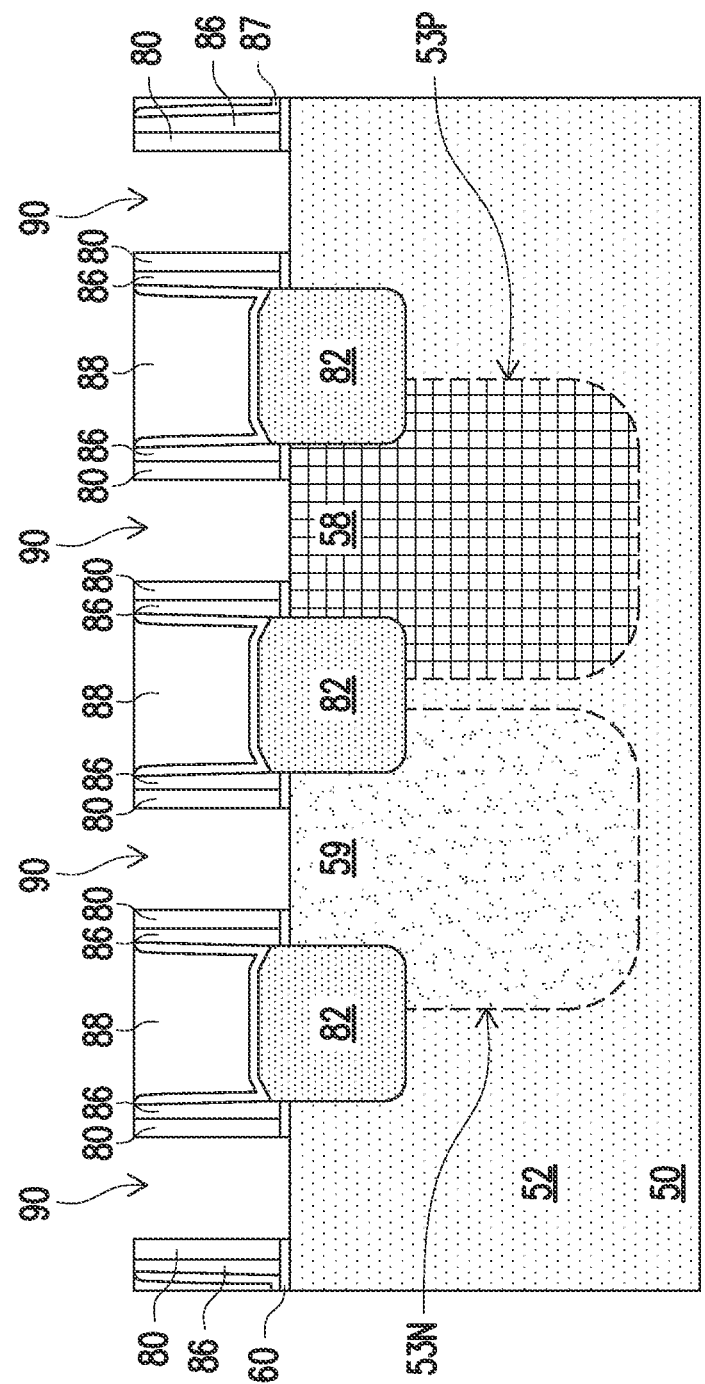

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 may expose and/or overlie a channel region 58 of a respective fin 52 or a conductive channel 59 of a respective fin 52. In this manner, each channel region 58 or conductive channel 59 is disposed between neighboring pairs of the epitaxial regions 82. During the removal, the dummy dielectric layer 60 may be used as an etch stop layer when the dummy gates 72 are etched. The dummy dielectric layer 60 may then be optionally removed after the removal of the dummy gates 72.

Figure 14A:
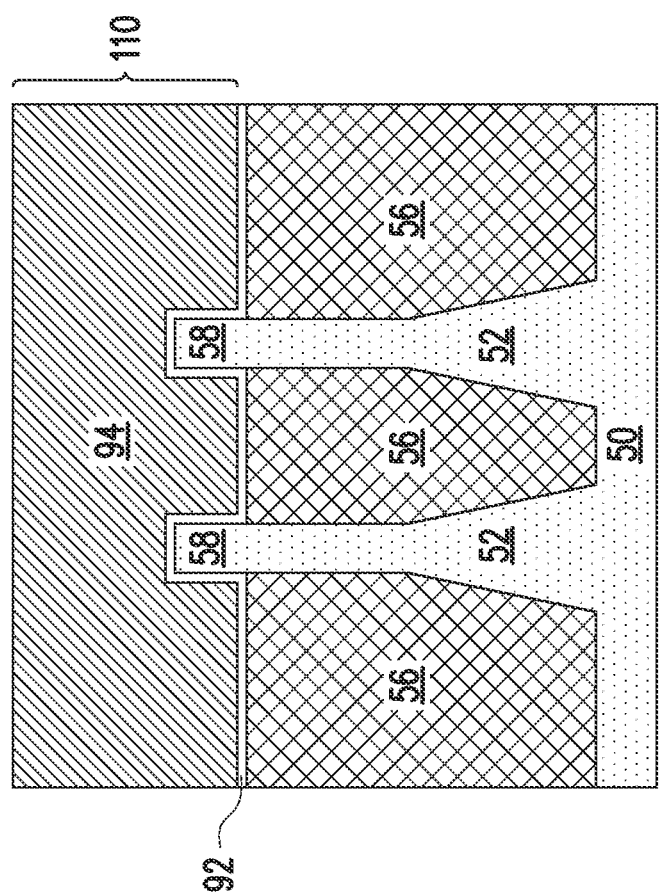
Figure 14B:
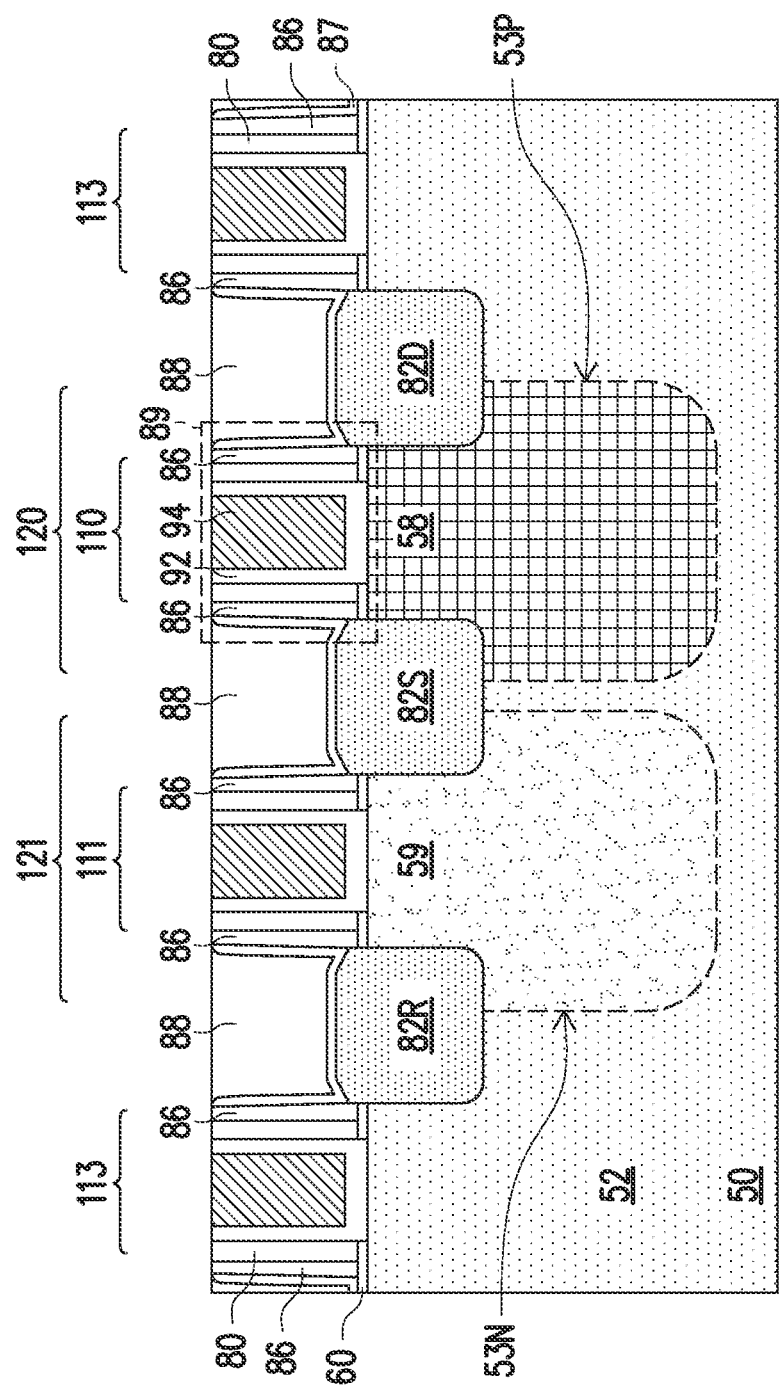
Figure 14C:
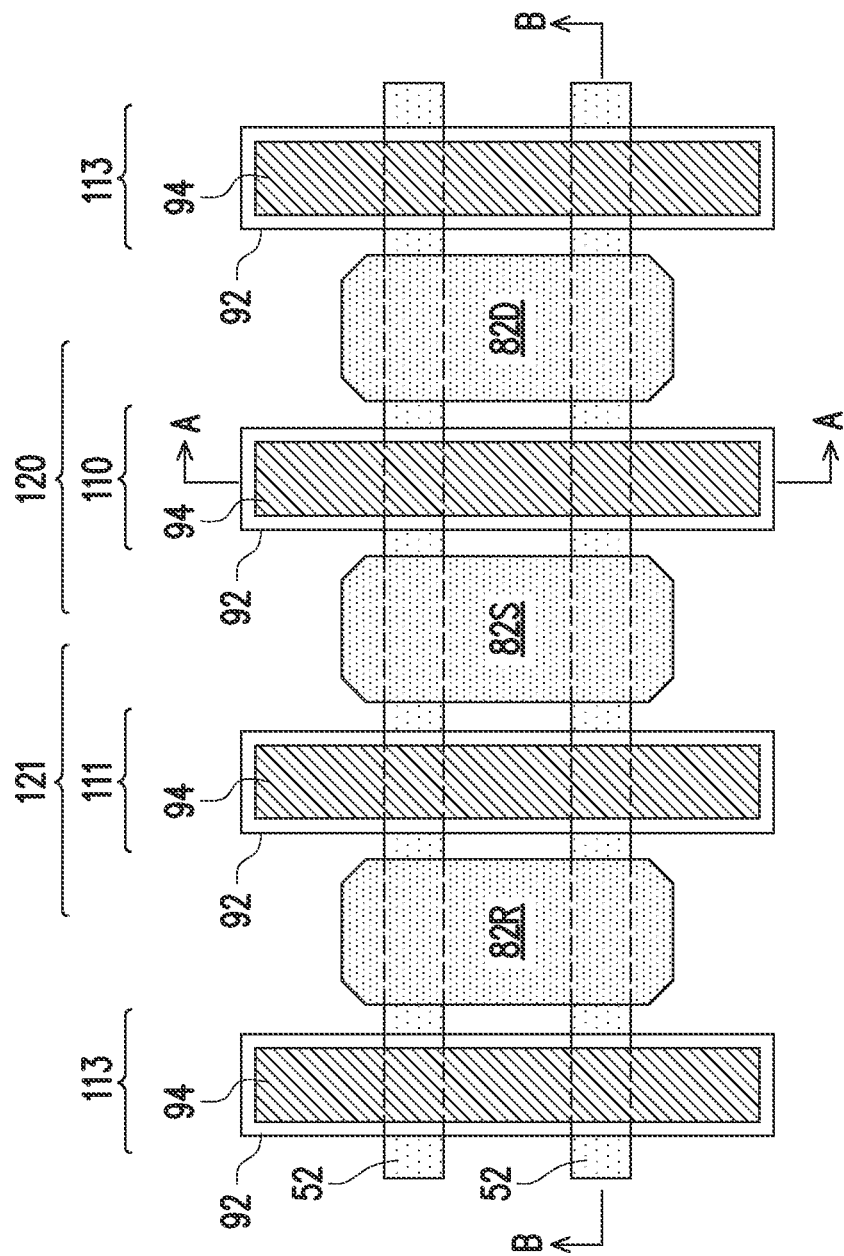
Figure 14D:
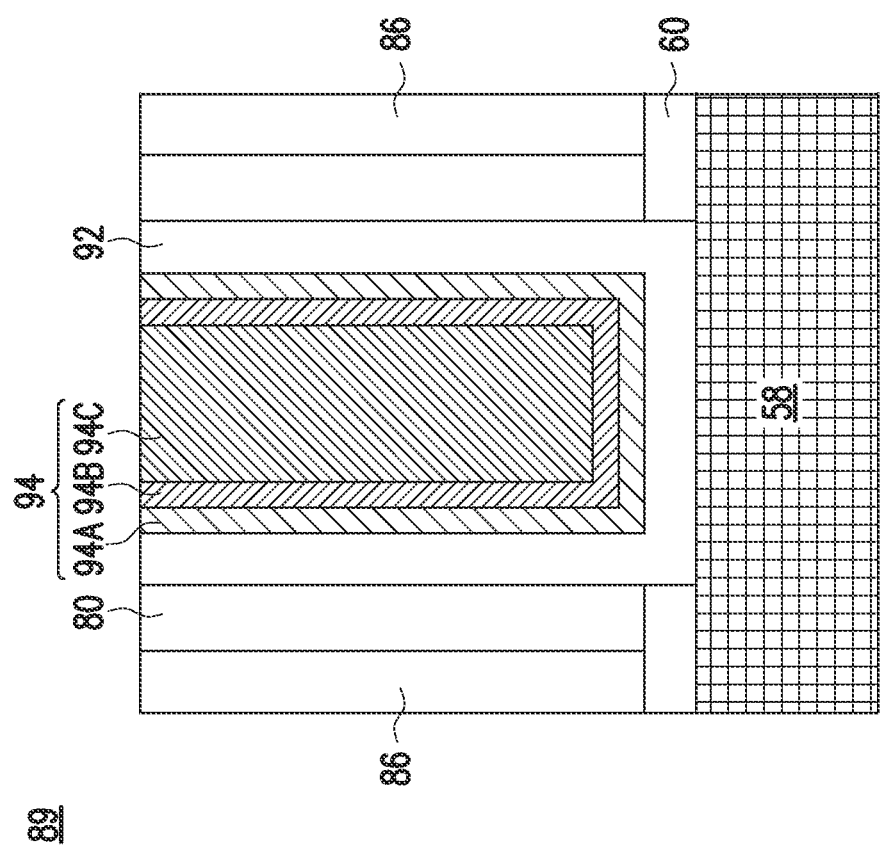

In FIGS. 14A, 14B, 14C, and 14D, gate dielectric layers 92 and gate electrodes 94 are formed in the recesses 90 to form gate structures 110 of FinFETs 120 and control structures 111 of active resistors 121, in accordance with some embodiments. FIG. 14A illustrates a cross-sectional view along reference cross-section A-A, and FIG. 14B illustrates a cross-sectional view along reference cross-section B-B. FIG. 14C illustrates a plan view, though some features are not shown for clarity reasons. FIG. 14D illustrates a detailed view of region 89 of FIG. 14B.

The gate dielectric layers 92 may comprise one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, the like, or combinations thereof. The gate dielectric layers 92 may include a dielectric layer having a k-value greater than about 7.0. The formation methods of the gate dielectric layers 92 may include Molecular-Beam Deposition (MBD), ALD, PECVD, or the like. In embodiments where portions of the dummy dielectric layer 60 remains in the recesses 90, the gate dielectric layers 92 include a material of the dummy dielectric layer 60 (e.g., silicon oxide).

The gate electrodes 94 are deposited over the gate dielectric layers 92, respectively and fill the remaining portions of the recesses 90. The gate electrodes 94 may include a metal-containing material such as titanium nitride, titanium oxide, tantalum nitride, tantalum carbide, cobalt, ruthenium, aluminum, tungsten, the like, combinations thereof, or multi-layers thereof. For example, although a single layer gate electrode 94 is illustrated in FIG. 14B, the gate electrode 94 may comprise any number of liner layers 94A, any number of work-function tuning layers 94B, and a fill material 94C, as illustrated by FIG. 14D After filling the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement structures of the resulting devices, such as gate structures 110 or control structures 111, described in greater detail below.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

The gate dielectric layers 92 and the gate electrodes 94 formed over a channel region 58 of a fin 52 may form a gate structure 110 of a FinFET 120, in some embodiments. The gate electrodes 94 and the gate dielectric layers 92 over a channel region 58 are collectively referred to as a gate structure 110 herein, but may also be referred to as a "replacement gate," a "gate stack," or the like. The gate structure 110 may extend along sidewalls of the corresponding channel region 58. The channel region 58 of a FinFET 120 may extend under the gate structure 110 and be disposed between neighboring epitaxial regions 82 comprising the source/drain regions of the FinFET 120. For example, as shown in FIG. 14B, the channel region 58 may be disposed between an epitaxial source region 82S and an epitaxial drain region 82D. A gate structure 110 may extend over one fin 52 or over multiple fins 52, and accordingly, a FinFET 120 may have a single fin 52 or multiple fins 52.

In some embodiments, the gate dielectric layers 92 and the gate electrodes 94 formed over a conductive channel 59 of a fin 52 may form a control structure 111 of an active resistor 121 (described in greater detail below for FIGS. 15A-15C). The gate electrodes 94 and the gate dielectric layers 92 over a conductive channel 59 are collectively referred to as a control structure 111 herein, but may also be referred to as a "control terminal," a "resistor control gate," or the like. The control structure 111 may extend along sidewalls of the corresponding conductive channel 59. The conductive channel 59 of an active resistor 121 may extend under the control structure 111 and be disposed between neighboring epitaxial regions 82 of the active resistor 121. In some embodiments, one of the neighboring epitaxial regions 82 of an active resistor 121 is also a source/drain region of an adjacent FinFET 120. For example, as shown in FIG. 14B, the conductive channel 59 may be disposed between an epitaxial source region 82S and an epitaxial resistor region 82R. In some embodiments, one of the neighboring epitaxial regions 82 of an active resistor 121 is also an epitaxial region of another adjacent active resistor 121, or is an epitaxial region of an adjacent passive resistor 123 (see FIGS. 17A-17D).

In some embodiments, some of the gate dielectric layers 92 and the gate electrodes 94 formed over a fin 52 may be dummy gate structures 113. In some cases, the dummy gate structures 113 are not a functional part of an active or passive device, and may be electrically isolated from other structures. In some cases, the dummy gate structures 113 are formed adjacent one side or opposite sides of a device such as a source-degenerated transistor device 125 (see FIGS. 15B-15C). In some embodiments, portions of dummy gate structures 113 are subsequently removed and replaced with an insulating material (not illustrated).

Figure 15A:
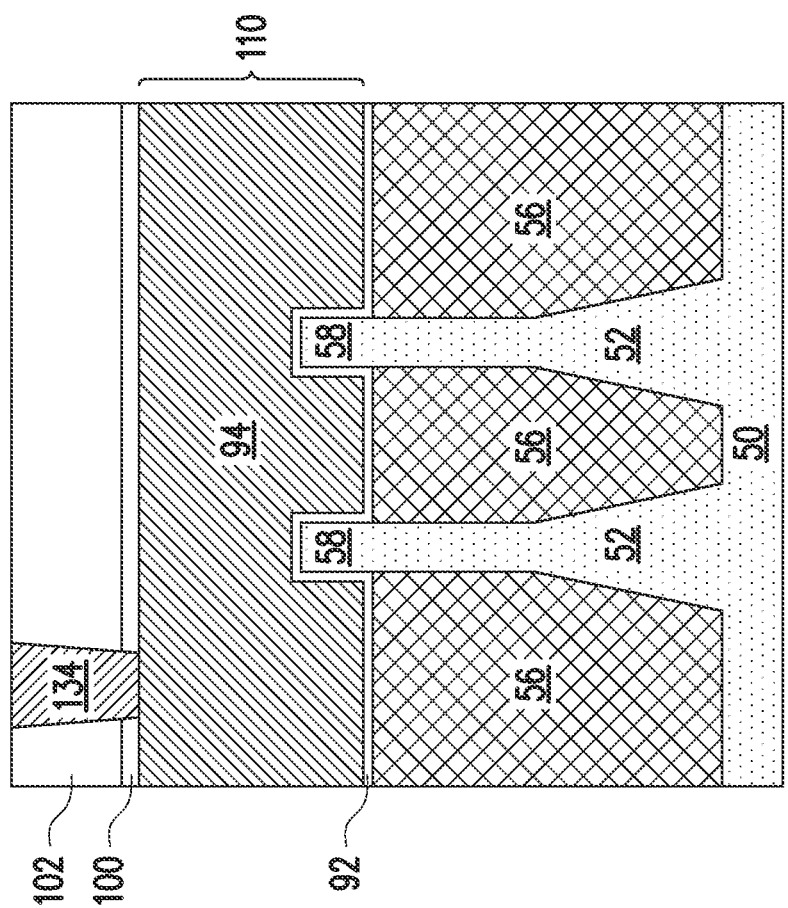
Figure 15B:
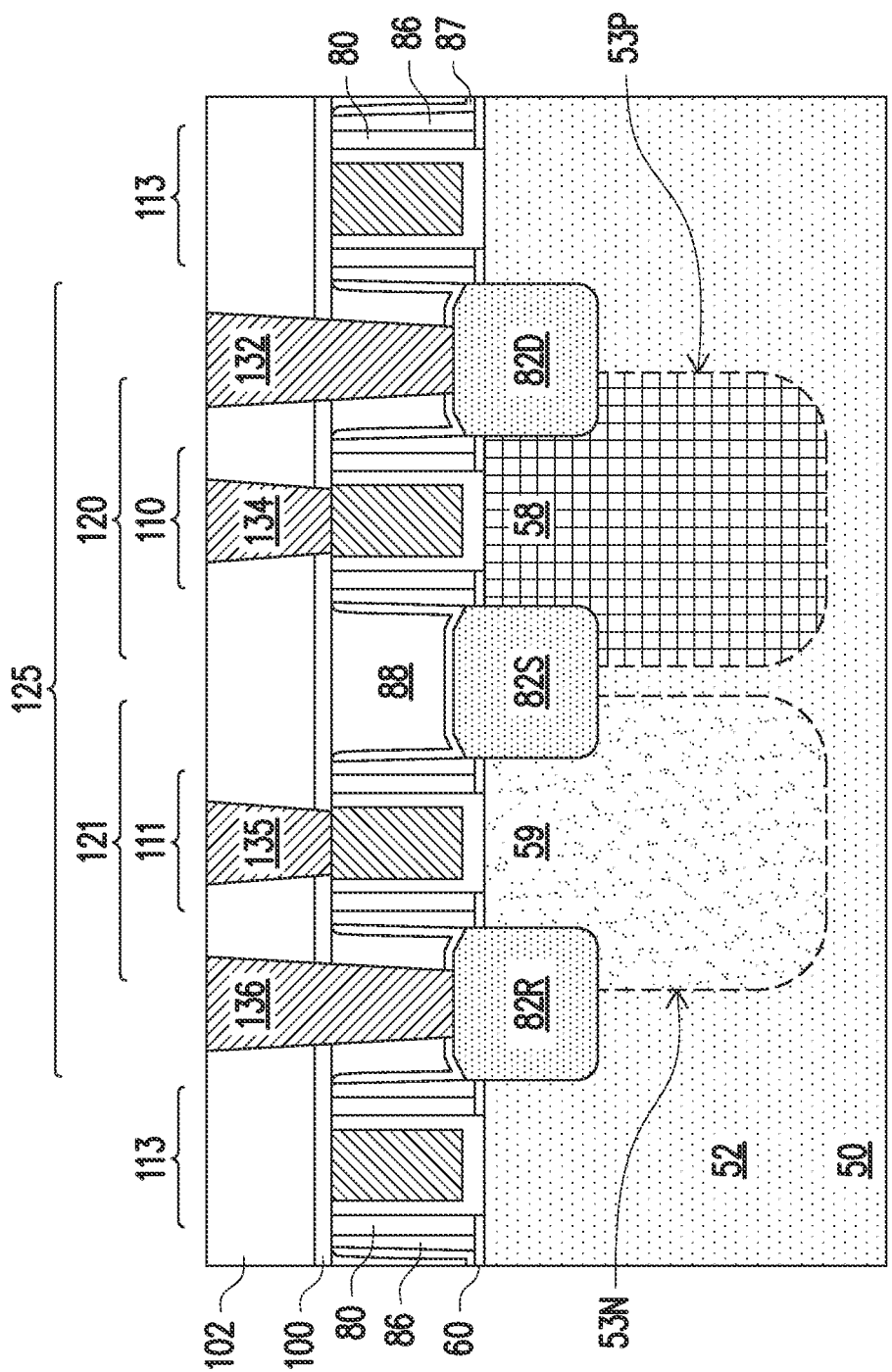
Figure 15C:
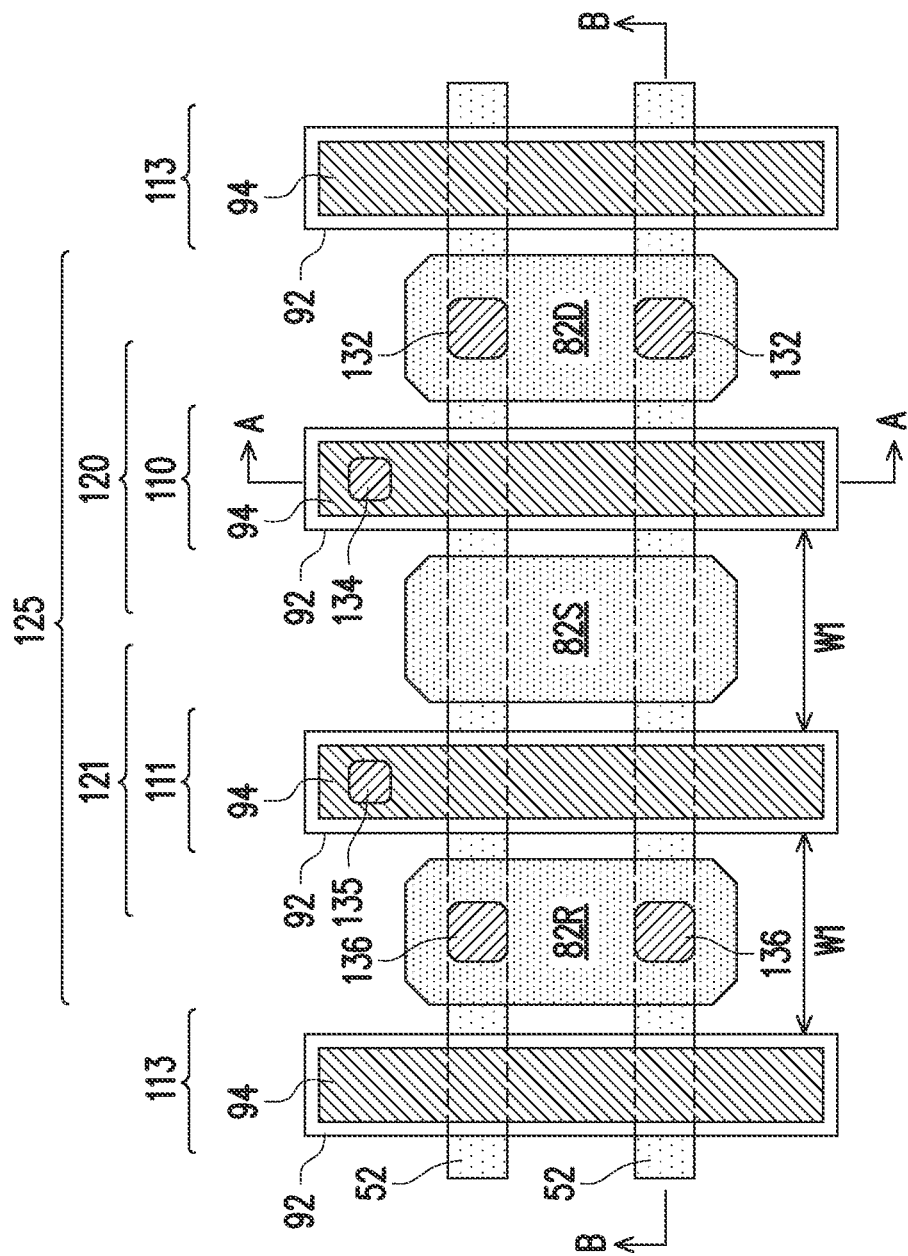

In FIGS. 15A, 15B, and 15C, various contacts are formed to epitaxial regions 82, gate structures 110, and control structures 111 to form a source-degenerated transistor device 125, in accordance with some embodiments. Initially, a gate mask 100 may be formed over the gate dielectric layers 92 and corresponding gate electrodes 94. In some embodiments, forming the gate mask 100 includes recessing the gate dielectric layers 92 and gate electrodes 94 so that a recess is formed between opposing portions of respective gate spacers 86. The gate mask 100 may comprise one or more layers of dielectric material, such as silicon nitride, silicon oxynitride, or the like, is filled in the recess, followed by a planarization process to remove excess portions of the dielectric material extending over the first ILD 88. In other embodiments, the gate dielectric layers 92 and gate electrodes 94 are not recessed. In some embodiments, the gate structure 110, control structure 111, or dummy gate structure 113 may remain level with top surfaces of the first ILD 88, as shown in FIG. 15B. The gate mask 100 is optional and may be omitted in some embodiments.

As also illustrated in FIGS. 15A and 15B, a second ILD 102 is deposited over the first ILD 88. In some embodiments, the second ILD 102 is a flowable film formed by a flowable CVD method. In some embodiments, the second ILD 102 is formed of a dielectric material such as PSG, BSG, BPSG, USG, or the like, and may be deposited by any suitable method, such as CVD and PECVD.

Contacts such as gate contacts 134, control contacts 135, and epitaxial region contacts 132/136 may then be formed through the second ILD 102 and the first ILD 88, in accordance with some embodiments. For example, openings for the epitaxial region contacts 132/136 may be formed through the first ILD 88, the second ILD 102, and the gate mask 100 (if present). Openings for the gate contacts 134 and control contacts 135 may be formed through the second ILD 102 and the gate mask 100 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, the like, or a combination thereof. A planarization process, such as a CMP, may be performed to remove excess material from a surface of the second ILD 102. The remaining liner and conductive material form the gate contacts 134, the control contacts 135, and the epitaxial region contacts 132/136 in the openings. An anneal process may be performed to form a silicide (not shown) at the interface between the epitaxial regions 82 and the epitaxial region contacts 132/136.

The epitaxial region contacts 132/136 are physically and electrically coupled to the epitaxial regions 82, the gate contacts 134 are physically and electrically coupled to the gate electrodes 94 of the gate structures 110, and the control contacts 135 are physically and electrically coupled to the gate electrodes 94 of the control structures 111. The epitaxial region contacts 132/136, the gate contacts 134, and/or the control contacts 135 may be formed in different processes, or may be formed in the same process. Although shown as being formed in the same cross-sections, it should be appreciated that each of the gate contacts 134, control contacts 135, and epitaxial region contacts 132/136 may be formed in different cross-sections, which may avoid shorting of the contacts. One or more epitaxial region contacts 132/136 may be formed on a epitaxial region 82, one or more gate contacts 134 may be formed on a gate structure 110, and one or more control contacts 135 may be formed on a control structure 111.

Figure 15D:
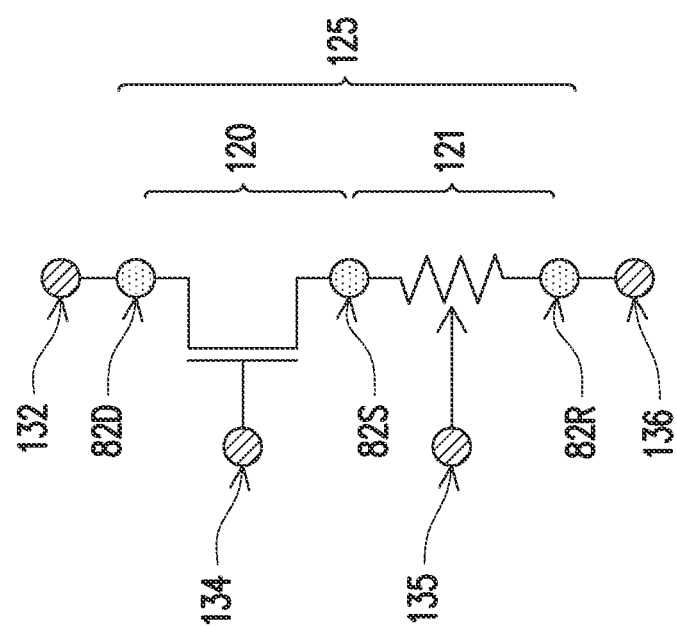
FIG. 15D is a schematic of a transistor device with an active resistor, in accordance with some embodiments.
Figure 16:
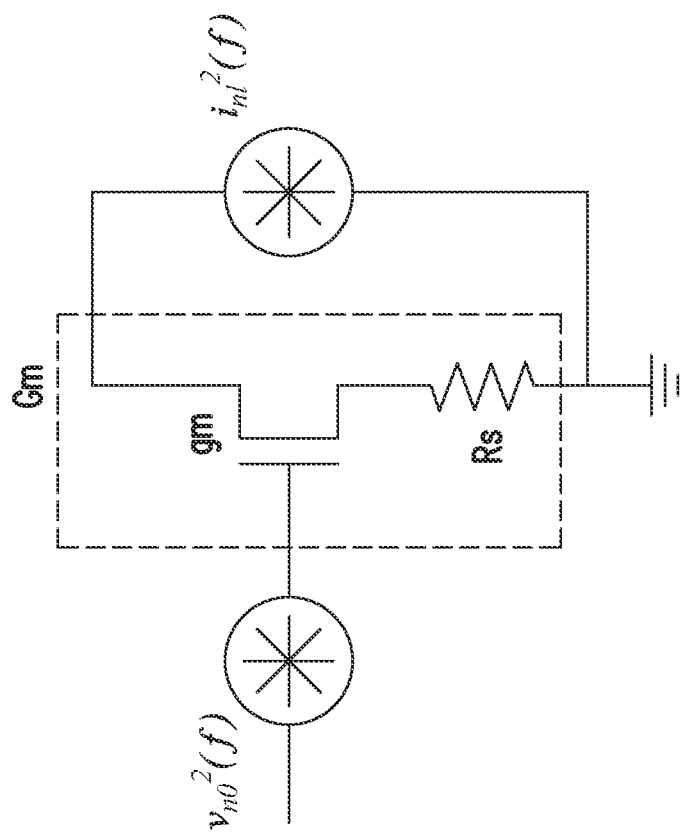
FIG. 16 is a schematic of a source-degenerated transistor, in accordance with some embodiments.

In this manner, a source-degenerated transistor (SDT) device 125 may be formed, in accordance with some embodiments. FIG. 15D illustrates a simplified circuit schematic of the SDT device 125 shown in FIGS. 15A-15C. The SDT device 125 shown in FIGS. 15A-15D includes an active resistor 121 electrically coupled in series with the epitaxial source region 82S of a FinFET 120. The epitaxial source region 82S of the FinFET 120 is free of contacts such that a current flowing through the FinFET 120 also flows through the active resistor 121. In other words, current flows through the SDT device 125 from the epitaxial region contact 132 to the epitaxial region contact 136 (or vice versa). In this manner, the active resistor 121 and the FinFET 120 together form a SDT device 125 that is similar to a transistor with source-degeneration, in which the active resistor 121 acts as a degeneration resistor.

In some embodiments, current in the active resistor 121 is conducted from the epitaxial source region 82S to the epitaxial resistor region 82R (or vice versa) through the conductive channel 59. In this manner, an active resistor 121 may be similar to a dopant diffused resistor in some cases. In some embodiments, the resistance of the active resistor 121 can be controlled by applying a voltage to the control structure 111 of the active resistor 121. The voltage may be applied to the control structure 111 through a corresponding control contact 135. In some cases, applying a voltage to the control structure 111 may cause accumulation or depletion of the conductive channel 59 that changes the resistance of the active resistor 121. For example, applying a more positive voltage to the control structure 111 of an active resistor 121 with an n-type conductive channel 59 can decrease the resistance of the active resistor 121, and applying a more negative voltage to the control structure 111 of an active resistor 121 with an n-type conductive channel 59 can increase the resistance of the active resistor 121. In this manner, an active resistor 121 may be similar to a depletion-mode MOSFET in some cases. The formation of an active resistor 121 as a degeneration resistor as described herein can allow for improved device flexibility, device parameter tuning, or more efficient device operation.

In some embodiments, an active resistor 121 may provide a resistance that is in the range of about 150 ohms to about 2000 ohms, though other resistances are possible. In some embodiments, applying appropriate voltages to the control structure 111 of an active resistor 121 can change the resistance of that active resistor 121 between about 5% and about 100%, though other resistances are possible. In some embodiments, the resistance or range of resistances of an active resistor 121 may be controlled by controlling the doping of the conductive channel 59. For example, in some cases, a conductive channel 59 with a higher doping concentration may result in the respective active resistor 121 having a smaller resistance. In some embodiments, the degeneration resistance of the SDT device 125 may be adjusted by forming more or fewer epitaxial region contacts 136. For example, a smaller number of epitaxial region contacts 136 on an epitaxial resistor region 82R may have a larger overall contact resistance than a larger number of epitaxial region contacts 136. Thus, forming fewer epitaxial region contacts 136 on a SDT device 125 can increase the degeneration resistance of the SDT device 125 due to an increase in contact resistance. In some embodiments, the control structure 111 of the active resistor 121 is equidistant between a neighboring gate structure 110 and a neighboring dummy gate structure 113. In some embodiments, the distance between the control structure 111 of the active resistor 121 and a neighboring gate structure 110 is approximately the distance W1 (see FIGS. 8B-8C). In some embodiments, the distance between the control structure 111 of the active resistor 121 and a neighboring dummy gate structure 113 is also approximately the distance W1.

FIGS. 15A-15D show an embodiment of a SDT device 125 with a single active resistor 121, but in other embodiments, a SDT device 125 may have more than one active resistor 121 (not illustrated). For example, a SDT device 125 may include two or more adjacent active resistors 121 disposed between the FinFET 120 and the epitaxial region contacts 136. In this manner, two or more active resistors 121 may be connected in series to increase the degeneration resistance of the SDT device 125. The conductive channel 59 of each respective active resistor 121 may be similar or may have different doping concentrations or doping profiles. A pair of neighboring active resistors 121 may share an epitaxial region 82. The respective control structures 111 of multiple active resistors 121 may be collectively controlled (e.g., electrically coupled) or may be independently controlled. In this manner, the characteristics or configuration of a SDT device 125 as described herein may be controlled to provide a desired degeneration resistance or desired range of degeneration resistances.

In some cases, forming a device comprising a transistor with source degeneration such as the SDT device 125 described herein can reduce the effects of noise and improve device operation. For example, in some cases, forming a SDT device 125 with an active resistor 121 as described herein can reduce the effects of flicker noise (e.g., 1/f noise). Turning to FIG. 17, a simplified schematic of a MOSFET with source degeneration is shown. The MOSFET in FIG. 17 is analogous to the FinFET 120 in the schematic of FIG. 15D, and the source degeneration of the MOSFET is provided by a resistor Rs, which is analogous to the active resistor 121 in the schematic of FIG. 15D. The flicker noise of the MOSFET may be modeled as a voltage source ($v_{no}^2$) in series with the gate of the MOSFET, which corresponds to an equivalent noise current ($i_{no}^2$) equal to ($gm^2 \, v_{no}^2$), where gm is the transconductance of the MOSFET. However, the transconductance Gm of the MOSFET with source degeneration resistor Rs is equal to (gm/(1+gm Rs)). Thus, the equivalent noise current ($i_{n1}^2$) of the MOSFET with source degeneration is equal to ($gm^2 \, v_{no}^2/(1+gm \, Rs)^2$), or ($i_{no}^2/(1+gm \, Rs)^2$)). In other words, the presence of the source degeneration resistor Rs effectively reduces the magnitude of the MOSFET's flicker noise, with a larger resistance of Rs resulting in a smaller noise magnitude. Similarly, the presence of the active resistor 121 in the SDT device 125 can effectively reduce the magnitude of the flicker noise of the FinFET 120. In this manner, the use of the SDT device 125 can reduce the effects of noise and improve device performance.

Figure 17A:
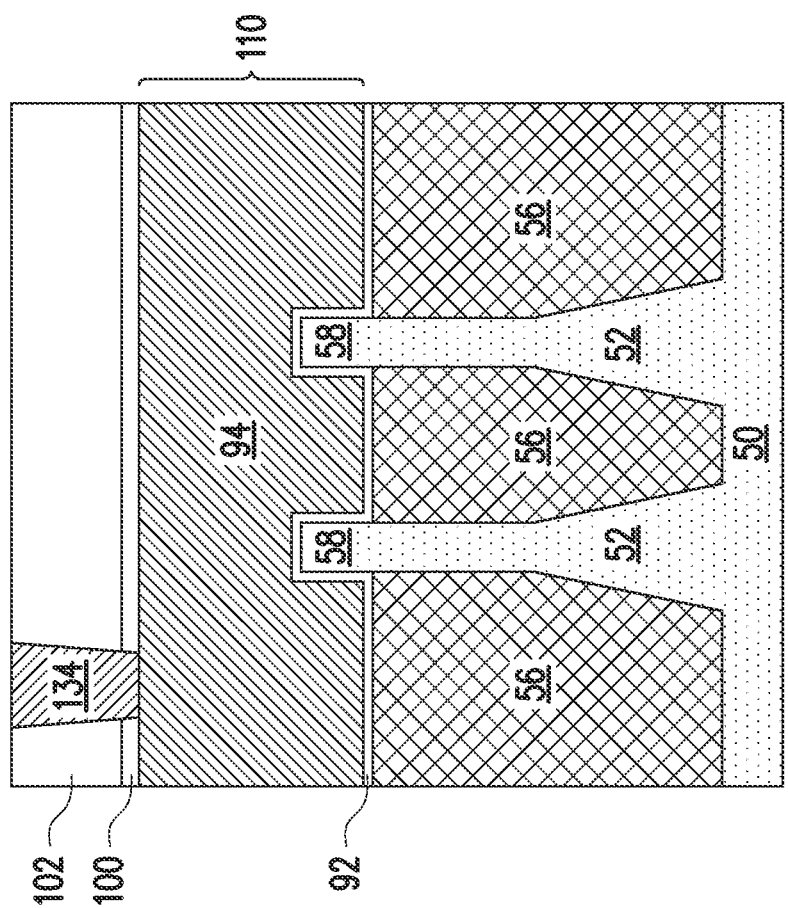
FIGS. 17A, 17B, and 17C are various views of intermediate stages in the manufacturing of a transistor device with an active resistor and a passive resistor, in accordance with some embodiments.
Figure 17B:
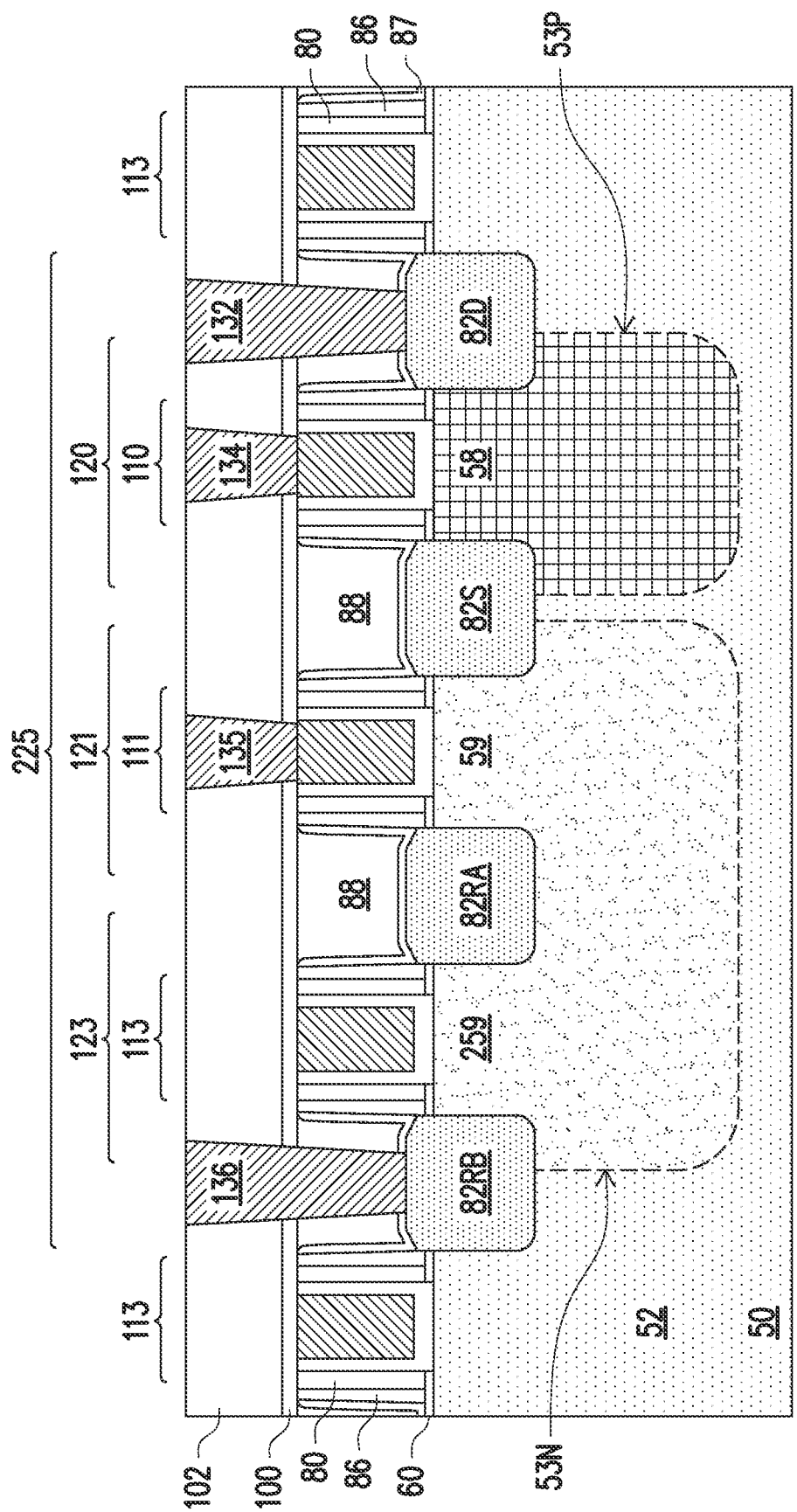
Figure 17C:
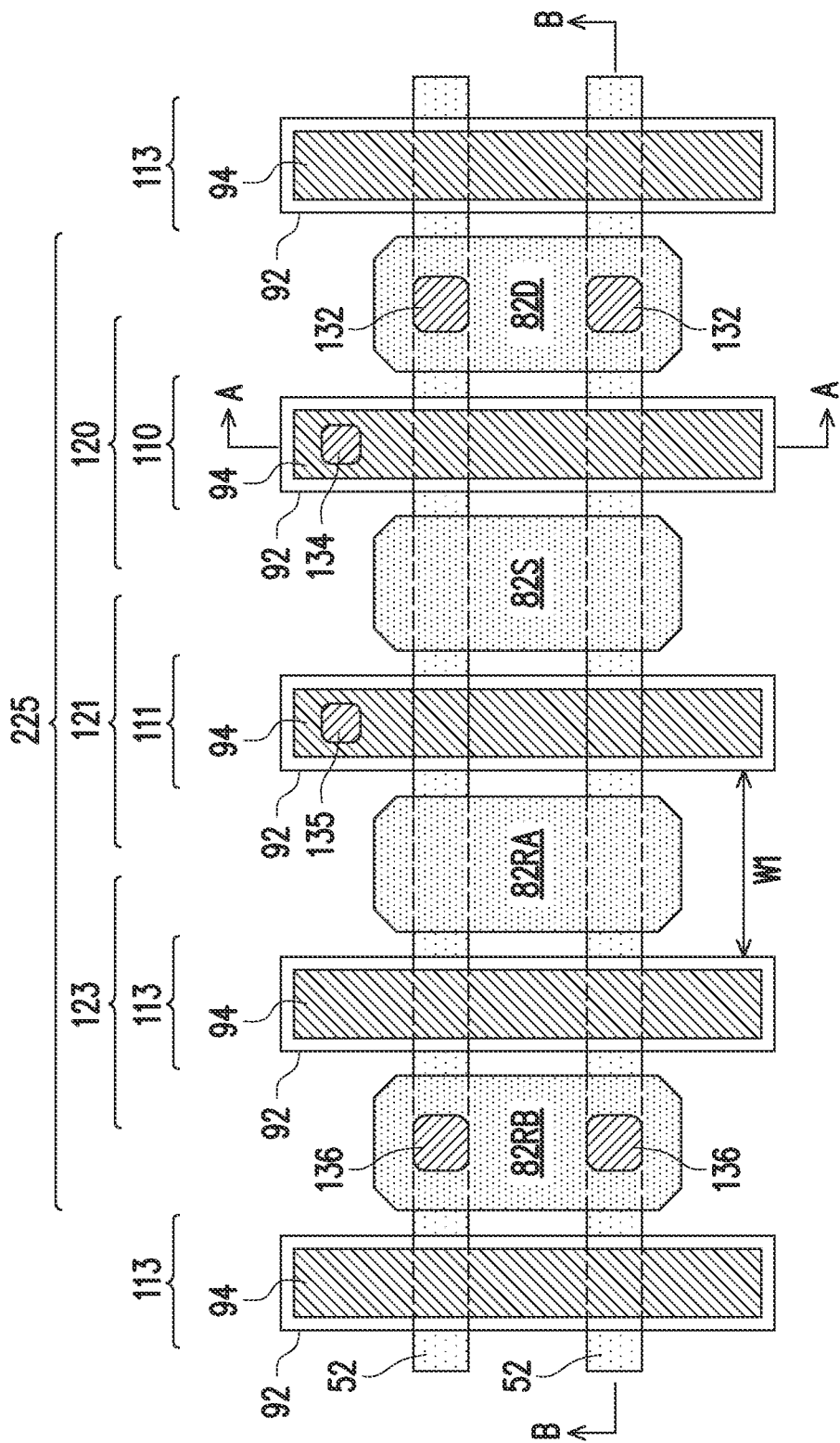
Figure 17D:
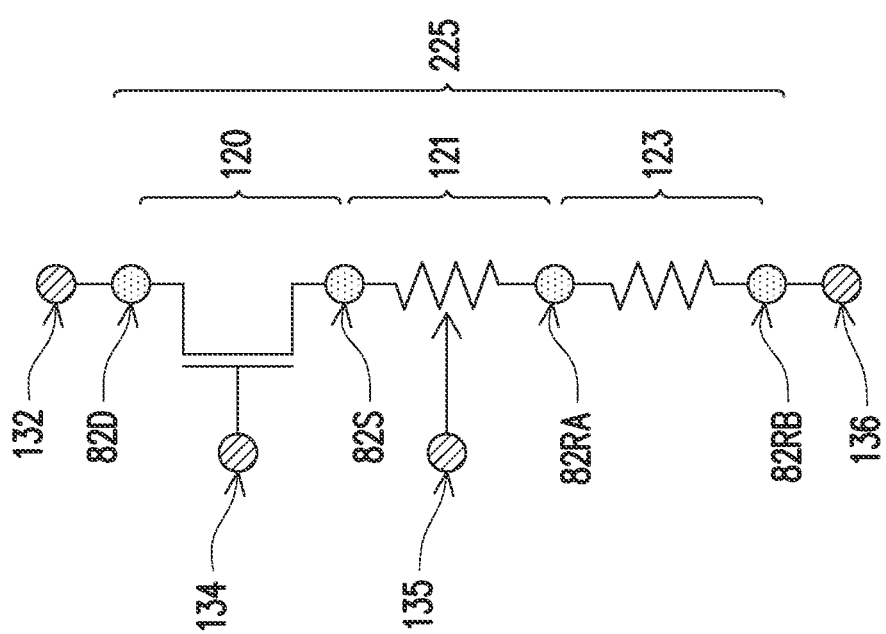
FIG. 17D is a schematic of a transistor device with an active resistor and a passive resistor, in accordance with some embodiments.

The SDT device 125 shown in FIGS. 15A-15D includes an active resistor 121 that provides degeneration resistance, but in other embodiments a passive resistor 123 may be used instead of or in addition to an active resistor 121. As an example, FIGS. 17A-17C illustrate a SDT device 225 that includes a passive resistor 123, in accordance with some embodiments. FIG. 17D illustrates a simplified circuit schematic of the SDT device 125 shown in FIGS. 17A-17C. The SDT device 225 shown in FIGS. 17A-17D is similar to the SDT device 125 shown in FIGS. 15A-15D, except that a passive resistor 123 is formed in the fins 52 in addition to an active resistor 121. The passive resistor 123 is electrically coupled in series with the active resistor 121, and thus adds to the degeneration resistance of the SDT device 225. A passive resistor 123 may be similar to an active resistor 121 as described herein, except that the resistance of the passive resistor 123 is substantially fixed and is not controlled by applying a control voltage.

A passive resistor 123 may be formed using a process similar to that described for an active resistor 121, except that control contacts 135 are not formed for the passive resistor 123. In this manner, the gate electrode 94 and the gate dielectric layer 92 over a passive resistor 123 may form a dummy gate structure 113. As shown in FIG. 17B, a passive resistor 123 may comprise a conductive channel 259 in a fin 52 that is disposed between neighboring epitaxial regions 82 of the passive resistor 123 (e.g. epitaxial resistor regions 82RA and 82RB in FIGS. 17B-17D). In some embodiments, one of the neighboring epitaxial regions 82 of an passive resistor 123 is also an epitaxial region 82 of an adjacent active resistor 121 (e.g. epitaxial resistor region 82RA in FIGS. 17B-17D), an adjacent FinFET 120, or another passive resistor 123. The conductive channel 259 of a passive resistor 123 may be similar to or different from a conductive channel 59 of an active resistor 121 in the same SDT device 225. In some embodiments, a passive resistor 123 may provide a resistance that is in the range of about 150 ohms to about 2000 ohms, though other resistances are possible. In some embodiments, the distance between the dummy gate structure 113 over the passive resistor 123 and a neighboring control structure 111 is approximately the distance W1 (see FIGS. 8B-8C).

The SDT device 225 shown in FIGS. 17A-17D is an example, and SDT devices having other configurations of active resistors 121 or passive resistors 123 are possible. For example, in other embodiments, a SDT device may have two or more active resistors 121 and/or two or more passive resistors 123. The conductive channels 59/259 of the active resistors 121 and passive resistors 123 may be similar or may be different (e.g., have different doping concentrations or doping profiles). In this manner, a suitable number of active resistors 121 and/or passive resistors 123 may be formed to provide a suitable degeneration resistance. The active resistors 121 and passive resistors 123 may be connected in any suitable series configuration to a FinFET 120. As a non-limiting example, a SDT device may be similar to the SDT device 225 of FIGS. 17A-17D except the passive resistor 123 is between the FinFET 120 and the active resistor 121. Other configurations are possible. Additionally, the active resistors 121 and passive resistors 123 may be arranged in any suitable series order. This can allow for flexibility in the design and layout of an SDT device. In some embodiments, the epitaxial regions 82 of the active resistors 121, passive resistors 123, and FinFET 120 all have the same pitch. In some embodiments, the distance W2 (see FIGS. 10B-10C) between neighboring epitaxial regions 82 may be controlled to control the lengths of the channel region 58, conductive channel 59, and conductive channel 259. In some cases, controlling the width W2 in this manner can also control the resistances of the active resistors 121 and the passive resistors 123.

Figure 18:
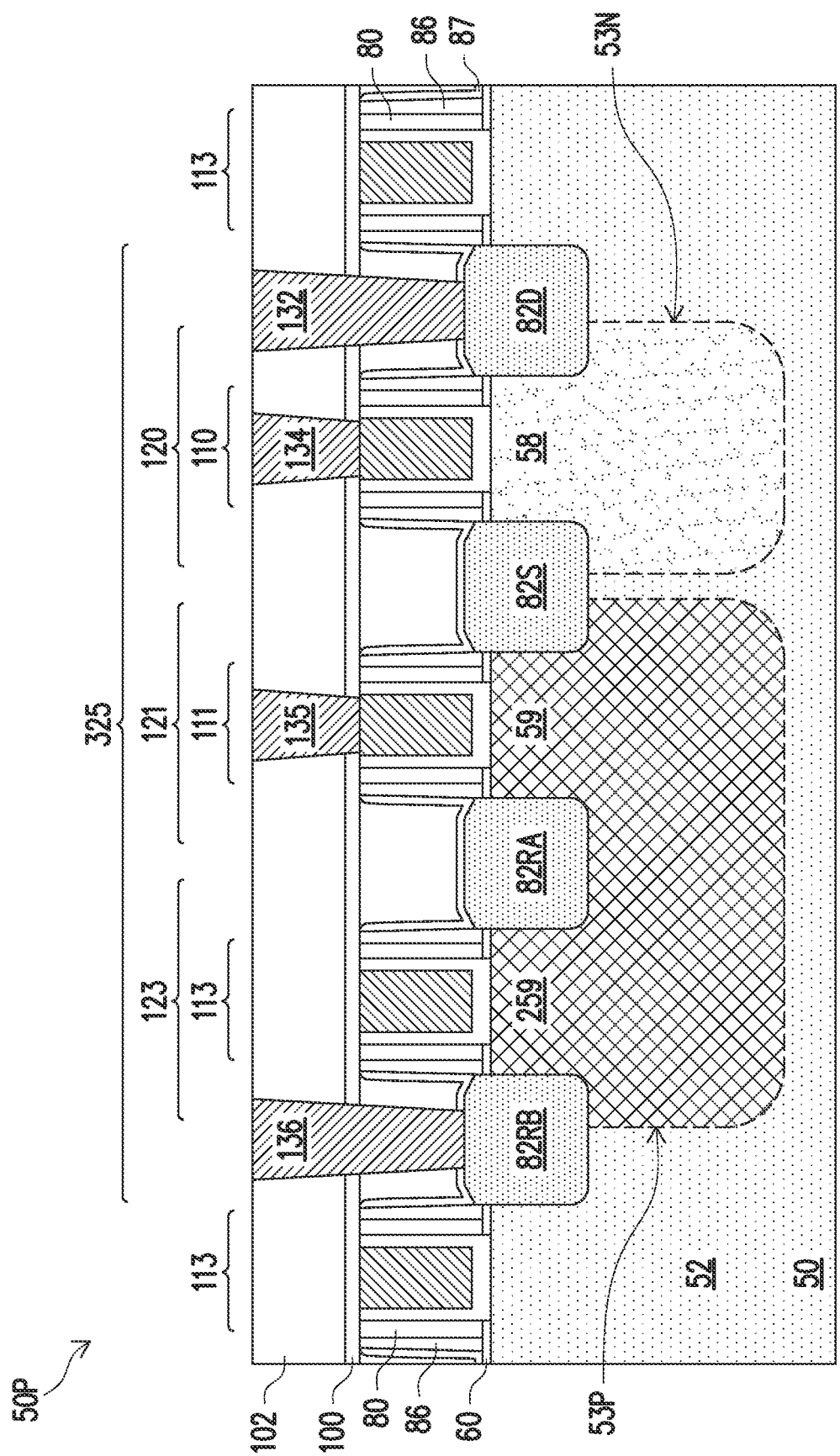
FIG. 18 is a cross-sectional view of an intermediate stage in the manufacturing of a transistor device with an active resistor and a passive resistor, in accordance with some embodiments.

The SDT devices 125 and 225 are described as being in the n-type region 50N, but SDT devices may also be formed in the p-type region 50P. As an illustrative example, FIG. 18 shows a SDT device 325 formed in the p-type region 50P, in accordance with some embodiments. The SDT device 325 is similar to the SDT device 225 described for FIGS. 17A-17D, except that the SDT device 325 is formed in the p-type region 50P instead of the n-type region 50N. Accordingly, the fin 52 may be doped with different dopant types and in different regions than the SDT device 225. For example, the FinFET 120 in the SDT device 325 may be a p-type FinFET, and the conductive channels 59/259 of the active resistors 121 and the passive resistors 123 may be doped with p-type dopants. The SDT device 325 is an illustrative example, and other configurations or variations are possible. In some embodiments, regions of STD devices in the n-type region 50N and regions of STD devices in the p-type region 50P are implanted in the same implant steps.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

Embodiments herein may achieve advantages. By forming a transistor device that includes one or more source degeneration resistors, the effects of transistor noise such as flicker noise can be reduced. This can improve the performance of devices such as RF devices or the like. The source degeneration resistors described herein include both passive resistors and variable resistors for which the resistance can be modulated with an applied voltage. The total degeneration resistance may be configured using a combination of one or more passive resistors and/or variable resistors, which allows for design flexibility. The source degeneration resistors described herein are formed using front-end-of-line (FEOL) processes, and may be formed having a smaller size than resistors formed using back-end-of-line (BEOL) processes, in some cases. For example, the source degeneration resistors may be formed in the same fins as an adjacent FinFET. Embodiments described herein also allow for source degeneration resistors to be formed without the addition of extra process steps. The features and techniques described herein may be used to form various transistor devices with resistors such as common source-amplifiers, common-drain amplifiers, or the like.

In accordance with some embodiments of the present disclosure, a method includes forming a semiconductor fin protruding from a substrate; forming a first resistor in the semiconductor fin, including: implanting the semiconductor fin to form a first conductive channel in the semiconductor fin; forming a first epitaxial region and a second epitaxial region in the semiconductor fin, wherein the first conductive channel is between the first epitaxial region and the second epitaxial region, wherein the first epitaxial region and the second epitaxial region have the same doping type as the first conductive channel; and forming a first gate stack over the first conductive channel; and forming a transistor in the semiconductor fin, including: forming a third epitaxial region in the semiconductor fin; and forming a second gate stack over the semiconductor fin, wherein the second gate stack is between the second epitaxial region and the third epitaxial region. In an embodiment, the method includes forming a contact to the first gate stack. In an embodiment, the second epitaxial region is a source region of the transistor and the third epitaxial region is a drain region of the transistor. In an embodiment, the method includes forming a second resistor in the semiconductor fin, including: implanting the semiconductor fin to form a second conductive channel in the semiconductor fin; forming a fourth epitaxial region in the semiconductor fin, wherein the second conductive channel is between the first epitaxial region and the fourth epitaxial region; and forming a third gate stack over the second conductive channel. In an embodiment, the method includes forming a contact to the third gate stack. In an embodiment, the doping type of the first conductive channel is p-type. In an embodiment, the first resistor has a resistance in the range of 150 ohms to 2000 ohms. In an embodiment, the first epitaxial region and the second epitaxial region are separated by a first distance, and the second epitaxial region and the third epitaxial region are separated by the first distance.

In accordance with some embodiments of the present disclosure, a method includes: forming a fin protruding from a substrate; implanting an n-type dopant in the fin to form an n-type channel region; implanting a p-type dopant in the fin to form a p-type channel region adjacent the n-type channel region; forming a first gate structure over the n-type channel region and a second gate structure over the p-type channel region; forming a first epitaxial region in the fin adjacent a first side of the first gate structure; forming a second epitaxial region in the fin adjacent a second side of the first gate structure and adjacent a first side of the second gate structure; and forming a third epitaxial region in the fin adjacent a second side of the second gate structure. In an embodiment, the n-type channel region extends from the first epitaxial region to the second epitaxial region and the p-type channel region extends from the second epitaxial region to the third epitaxial region. In an embodiment, the first epitaxial region, the second epitaxial region, and the third epitaxial region are n-type. In an embodiment, the method includes forming a first gate contact to the first gate structure and a first epitaxial contact to the first epitaxial region. In an embodiment, the method includes forming a second gate contact to the second gate structure. In an embodiment, the second epitaxial region is free of contacts. In an embodiment, the second gate structure is a dummy gate structure. In an embodiment, the method includes forming a dummy gate structure over the fin adjacent the third epitaxial region.

In accordance with some embodiments of the present disclosure, a semiconductor device includes: a fin over a semiconductor substrate; an epitaxial source region and an epitaxial drain region in the fin; a gate structure extending over the fin between the epitaxial source region and the epitaxial drain region, the gate structure including a gate electrode material over a gate dielectric material; a doped region of the fin adjacent the gate source region opposite the gate structure, wherein the epitaxial source region extends into the doped region; a control structure extending over the doped region, the gate structure including the gate electrode material over the gate dielectric material; and an epitaxial resistor region in the fin, wherein the epitaxial resistor region extends into the doped region. In an embodiment, the epitaxial resistor region is free of contacts. In an embodiment, the semiconductor device includes a contact on the control structure. In an embodiment, the doped region is n-type and the epitaxial source region is n-type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a singular semiconductor fin protruding from a substrate;
    forming a first resistor in the singular semiconductor fin, comprising:
        implanting the singular semiconductor fin to form a first conductive channel in the singular semiconductor fin;
        forming a first epitaxial region and a second epitaxial region in the singular semiconductor fin, wherein the first conductive channel is between the first epitaxial region and the second epitaxial region, wherein the first epitaxial region and the second epitaxial region have a same doping type as the first conductive channel; and
        forming a first gate stack over the first conductive channel; and
    forming a transistor in the singular semiconductor fin, comprising:
        implanting the singular semiconductor fin to form a second conductive channel in the singular semiconductor fin, the second conductive channel having an opposite doping type as the first conductive channel;
        forming a third epitaxial region in the singular semiconductor fin; and
        forming a second gate stack over the second conductive channel in the singular semiconductor fin, wherein the second gate stack is between the second epitaxial region and the third epitaxial region.

2. The method of claim 1 further comprising forming a contact to the first gate stack.

3. The method of claim 1, wherein the second epitaxial region is a source region of the transistor and the third epitaxial region is a drain region of the transistor.

4. The method of claim 1 further comprising forming a second resistor in the singular semiconductor fin, comprising:
   forming a fourth epitaxial region in the singular semiconductor fin, wherein the first conductive channel is between the first epitaxial region and the fourth epitaxial region; and
   forming a third gate stack over the first conductive channel.

5. The method of claim 4 further comprising forming a contact to the third gate stack.

6. The method of claim 1, wherein the doping type of the first conductive channel is n-type.

7. The method of claim 1, wherein the first resistor has a resistance in the range of 150 ohms to 2000 ohms.

8. The method of claim 1, wherein the first epitaxial region and the second epitaxial region are separated by a first distance, and wherein the second epitaxial region and the third epitaxial region are separated by the first distance.

9. A method, comprising:
   forming a singular fin protruding from a substrate;
   implanting an n-type dopant in the singular fin to form an n-type channel region in the singular fin;
   implanting a p-type dopant in the singular fin to form a p-type channel region in the singular fin and adjacent the n-type channel region;
   forming a first gate structure over the n-type channel region and a second gate structure over the p-type channel region;
   forming a first epitaxial region in the singular fin adjacent a first side of the first gate structure;
   forming a second epitaxial region in the singular fin adjacent a second side of the first gate structure and adjacent a first side of the second gate structure; and
   forming a third epitaxial region in the singular fin adjacent a second side of the second gate structure.

10. The method of claim 9, wherein the n-type channel region extends from the first epitaxial region to the second epitaxial region and the p-type channel region extends from the second epitaxial region to the third epitaxial region.

11. The method of claim 9, wherein the first epitaxial region, the second epitaxial region, and the third epitaxial region are n-type.

12. The method of claim 9 further comprising forming a first gate contact to the first gate structure and a first epitaxial contact to the first epitaxial region.

13. The method of claim 12 further comprising forming a second gate contact to the second gate structure.

14. The method of claim 9, wherein the second epitaxial region is free of contacts.

15. The method of claim 9, wherein the second gate structure is a dummy gate structure.

16. The method of claim 9 further comprising forming a dummy gate structure over the singular fin adjacent the third epitaxial region.

17. A method, comprising:
   forming a fin over a semiconductor substrate;
   forming a doped region of the fin;
   forming an epitaxial source region and an epitaxial drain region in the fin, wherein the epitaxial source region extends into the doped region, wherein the epitaxial source region is between the doped region and the epitaxial drain region;
   forming a gate structure extending over a region of the fin between the epitaxial source region and the epitaxial drain region, wherein forming the gate structure comprises depositing a gate dielectric material and depositing a gate electrode material over the gate dielectric material;
   forming a control structure extending over the doped region, wherein forming the control structure comprises depositing the gate dielectric material and depositing the gate electrode material over the gate dielectric material; and
   forming an epitaxial resistor region in the fin, wherein the epitaxial resistor region extends into the doped region.

18. The method of claim 17, wherein the epitaxial resistor region is free of contacts.

19. The method of claim 17 further comprising forming a contact on the control structure.

20. The method of claim 17, wherein the doped region is n-type and the epitaxial source region is n-type.

\* \* \* \* \*